US011647597B2

(12) United States Patent
Liu

(10) Patent No.: US 11,647,597 B2
(45) Date of Patent: May 9, 2023

(54) ELECTRONIC DEVICE

(71) Applicant: BEIJING XIAOMI MOBILE SOFTWARE CO., LTD., Beijing (CN)

(72) Inventor: Zhenhua Liu, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 64 days.

(21) Appl. No.: 17/329,640

(22) Filed: May 25, 2021

(65) Prior Publication Data
US 2022/0183167 A1 Jun. 9, 2022

(30) Foreign Application Priority Data
Dec. 7, 2020 (CN) ......................... 202011438538.2

(51) Int. Cl.
H05K 5/02 (2006.01)
G06F 1/16 (2006.01)

(52) U.S. Cl.
CPC ......... *H05K 5/0217* (2013.01); *G06F 1/1652* (2013.01)

(58) Field of Classification Search
CPC .............................. G06F 1/1652; H05K 5/0217
See application file for complete search history.

(56) References Cited

U.S. PATENT DOCUMENTS

| 10,747,269 | B1* | 8/2020 | Choi | ..................... G06F 1/1624 |
| 10,976,775 | B1* | 4/2021 | Cha | ....................... G06F 1/1652 |
| 2014/0194165 | A1* | 7/2014 | Hwang | ................. G06F 1/1652 |
| | | | | 455/566 |
| 2018/0014417 | A1* | 1/2018 | Seo | ......................... H05K 1/189 |
| 2018/0077808 | A1* | 3/2018 | Seo | ......................... G06F 3/044 |
| 2018/0192527 | A1* | 7/2018 | Yun | ....................... G06F 1/1681 |
| 2020/0264660 | A1* | 8/2020 | Song | ..................... G06F 1/1686 |
| 2020/0267246 | A1* | 8/2020 | Song | ..................... H05K 1/148 |

(Continued)

FOREIGN PATENT DOCUMENTS

| KR | 20180039027 A | 4/2018 |
| KR | 20190053264 A | 5/2019 |

(Continued)

OTHER PUBLICATIONS

European Patent Application No. 21176709.0 extended Search and Opinion dated Dec. 3, 2021, 12 pages.

(Continued)

*Primary Examiner* — Hung S. Bui
*Assistant Examiner* — Sagar Shrestha
(74) *Attorney, Agent, or Firm* — Cozen O'Connor

(57) ABSTRACT

The present disclosure relates to an electronic device including a telescopic driving mechanism and a flexible display screen. The telescopic driving mechanism includes a housing and a movable assembly, and the movable assembly is slidably coupled to the housing and may be driven to move towards or away from the housing. The flexible display screen includes a first end and a second end arranged oppositely. The first end is coupled to the housing and located at a front surface of the electronic device. The second end is coupled to the movable assembly and wound to a rear surface of the electronic device via a side surface of the electronic device. The second end moves towards or away from the first end as the movable assembly is moved relative to the housing.

19 Claims, 26 Drawing Sheets

(56) References Cited

U.S. PATENT DOCUMENTS

| | | | | |
|---|---|---|---|---|
| 2020/0267247 A1* | 8/2020 | Song | ............... | G06F 1/1624 |
| 2020/0363841 A1* | 11/2020 | Kim | ............... | G06F 1/1626 |
| 2021/0278878 A1* | 9/2021 | Shim | ............... | G06F 1/1681 |
| 2021/0307186 A1* | 9/2021 | Hong | ............... | G06F 1/1681 |
| 2021/0366318 A1* | 11/2021 | Feng | ............... | G06F 1/1652 |

FOREIGN PATENT DOCUMENTS

| | | |
|---|---|---|
| KR | 20190062855 A | 6/2019 |
| KR | 20190124009 A | 11/2019 |
| WO | WO 2019209041 A1 | 10/2019 |

OTHER PUBLICATIONS

Korean Patent Application No. 10-2021-0065222, Office Action dated Jun. 16, 2022, 5 pages.
Korean Patent Application No. 10-2021-0065222, English translation of Office Action dated Jun. 16, 2022, 6 pages.
Japanese Patent Application No. 2021-087742, Office Action dated Jul. 26, 2022, 3 pages.
Japanese Patent Application No. 2021-087742, English translation of Office Action dated Jul. 26, 2022, 3 pages.

\* cited by examiner

ELECTRONIC DEVICE

CROSS-REFERENCE TO RELATED APPLICATION

This application claims priority to and benefits of Chinese Patent Application Serial No. 202011438538.2, filed with National Intellectual Property Administration of PRC on Dec. 7, 2020, the entire content of which is incorporated herein by reference.

FIELD

The present disclosure relates to a field of electronic devices, and particularly to an electronic device with a flexible display.

BACKGROUND

With the continued development of hardware technology, electronic devices having a wide variety of usage forms and sizes may be found. However, in the related art, a display screen of an electronic device is usually configured as a straight screen for a given electronic device, and a size thereof is fixed and is difficult to change to adapt to different display requirements. This makes it difficult for the electronic device to present a matched display area according to user requirements, resulting in a poor user experience.

SUMMARY

Embodiments of the present disclosure provide an electronic device, including: a telescopic driving mechanism including a housing and a movable assembly, the movable assembly being slidably coupled to the housing and being able to be driven to move towards or away from the housing; and a flexible display screen including a first end and a second end arranged oppositely. The first end is coupled to the housing and located at a front surface of the electronic device; and the second end is coupled to the movable assembly and wound to a rear surface of the electronic device via a side surface of the electronic device; and the second end moves towards or away from the first end as the movable assembly is moved relative to the housing.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

FIG. 15a is a sectional view of the telescopic elastic member illustrated in FIG. 13a;

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with some aspects related to the disclosure as recited in the appended claims.

The terminology used herein is for the purpose of describing particular embodiments only and is not intended to be limiting of the disclosure. Unless defined otherwise, the technical or scientific terms used in the disclosure should have the same meanings as commonly understood by one of ordinary skilled in the art to which the present disclosure belongs. The terms "a", "an" and the like used in the specification and the claims of the disclosure do not denote a limitation of quantity, but denote the existence of at least one. Unless otherwise stated, the terms "comprises", "comprising", "includes", "including" and the like mean that the element or object in front of the "comprises", "comprising", "includes" and "including" encompasses the elements or objects and their equivalents illustrated following the "comprises", "comprising", "includes" and "including", but do not exclude other elements or objects. The term "coupled", "connected" or the like is not limited to being connected physically or mechanically, but may include electric connection, direct or indirect. As used in the description of the present disclosure and the claims, "a" and "the" in singular forms mean including plural forms, unless clearly indicated in the context otherwise. It should also be understood that, as used herein, the term "and/or" represents containing any one or all possible combinations of one or more associated listed items.

The embodiments of the present disclosure provide an electronic device having an extended form and a retracted form, and in different forms, a display screen of the electronic device has different sizes, thus meeting different requirements of a user and optimizing the user experience.

In the embodiments of the present disclosure, the electronic device includes, but not limited to: a smart phone, a tablet computer, a desktop/laptop/handheld computer, a notebook computer, an ultra-mobile personal computer (UMPC), a personal digital assistant (PDA), and an augmented reality (AR)/virtual reality (VR) apparatus. The accompanying drawings are presented only with a mobile phone as an example.

Figure 1:
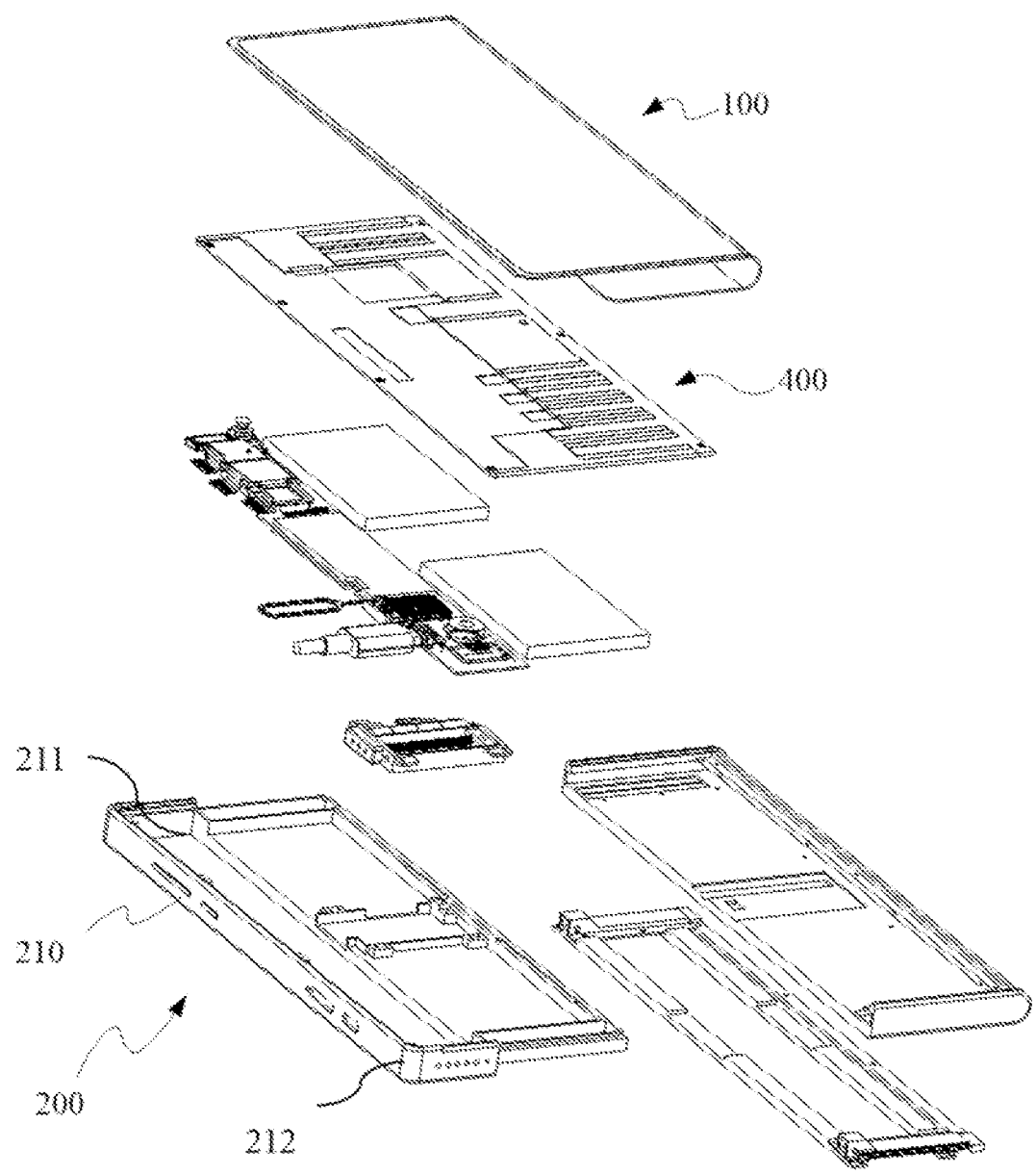
FIG. 1 is an exploded view of an electronic device according to an exemplary embodiment.

FIG. 1 is an exploded view of an electronic device according to an exemplary embodiment. As illustrated in FIG. 1, the electronic device includes a flexible display screen 100 and a telescopic driving mechanism 200.

Figure 2:
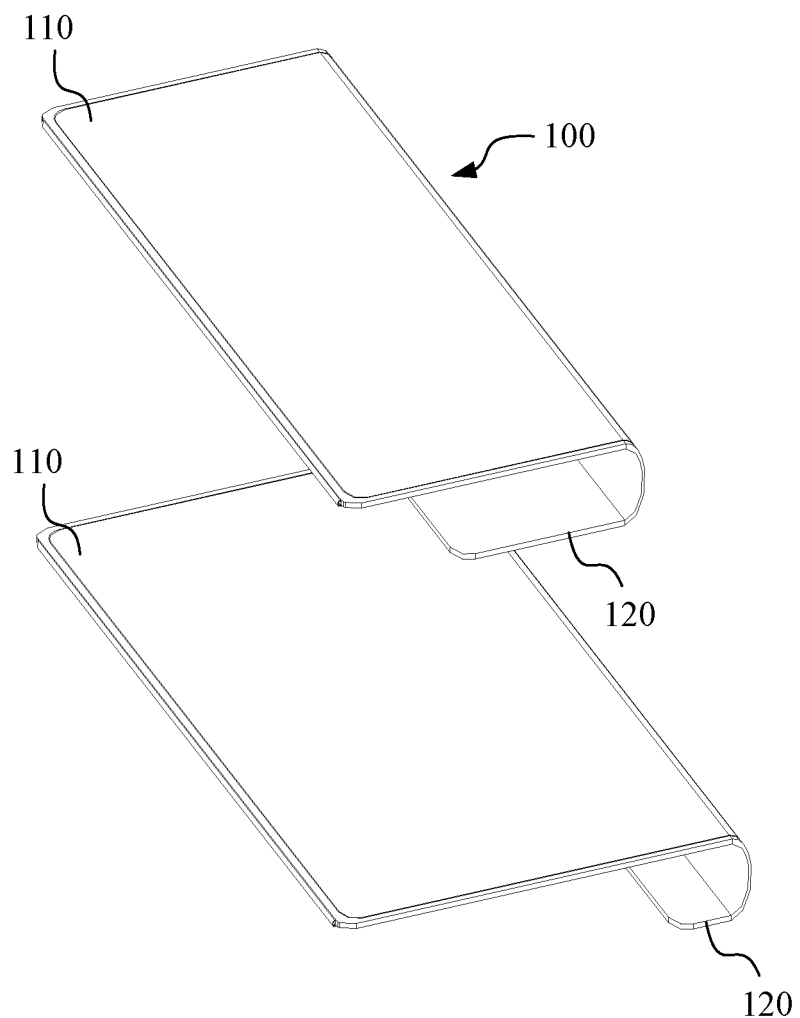
FIG. 2 is a schematic structural diagram of a flexible display screen according to an exemplary embodiment.

FIG. 2 is a schematic structural diagram of a flexible display screen according to an exemplary embodiment. As illustrated in FIG. 2, the flexible display screen 100 includes a first end 110 and a second end 120 arranged oppositely. The flexible display screen 100 has a bent form. The flexible display screen 100 is bent and extends from a front surface of the electronic device to a rear surface of the electronic device via a side surface of the electronic device. The first end 110 is configured to be provided at the front surface of the electronic device, and the second end 120 is configured to be provided at the rear surface of the electronic device.

The telescopic driving mechanism 200 includes a housing 210 and a movable assembly 220. The movable assembly 220 is slidably coupled to the housing 210 and may be driven towards or away from the housing 210. The housing 210 is coupled to the first end 110 of the flexible display screen 100, and the movable assembly 220 is coupled to the second end 120 of the flexible display screen 100. At this point, the second end 120 moves towards or away from the first end 110 along with the movable assembly 220 relative to the housing 210.

When the movable assembly 220 moves away from the housing 210, the electronic device is in the extended form. At this point, the second end 120 of the flexible display screen 100 moves away from the first end 110. Accordingly, part of the flexible display screen 100 located at the rear surface of the electronic device is turned to the front surface of the electronic device. At this point, the size of a display screen at the front surface of the electronic device is increased.

When the movable assembly 220 moves towards the housing 210, the electronic device is in the retracted form. At this point, the second end 120 of the flexible display screen 100 moves towards the first end 110. Accordingly, part of the flexible display screen 100 located at the front surface of the electronic device is turned to the rear surface of the electronic device. At this point, the size of the display screen at the front surface of the electronic device is reduced.

In this way, the electronic device according to the embodiments of the present disclosure may be switched between the extended and retracted forms. Display regions with different sizes are realized at the front surface of the electronic device through the extended and retracted forms. In this way, the electronic device may adapt to different use scenarios, meet different user requirements and optimize the user experiences.

In an embodiment, with continued reference to FIG. 1, the movable assembly 220 includes a movable member 220A and a telescopic elastic member 220B which are coupled. That is, the telescopic driving mechanism 200 includes the housing 210, the movable member 220A and the telescopic elastic member 220B, and serves as a key component in the electronic device according to the embodiments of the present disclosure. An implementation of the telescopic driving mechanism 200 will be described in detail below with reference to the accompanying drawings.

1. Structures of the Housing 210 and the Movable Member 220A

The movable member 220A is movably coupled to the housing 210 for abutting against a part of the flexible display screen 100 corresponding to the side surface of the electronic device. The movable member 220A is driven to move relative to the housing 210 to apply an acting force to the part of the flexible display screen 100 corresponding to the side surface of the electronic device, so as to urge the second end 120 of the flexible display screen 100 to move away from the first end 110, such that the electronic device is switched to the extended form.

Figure 3:
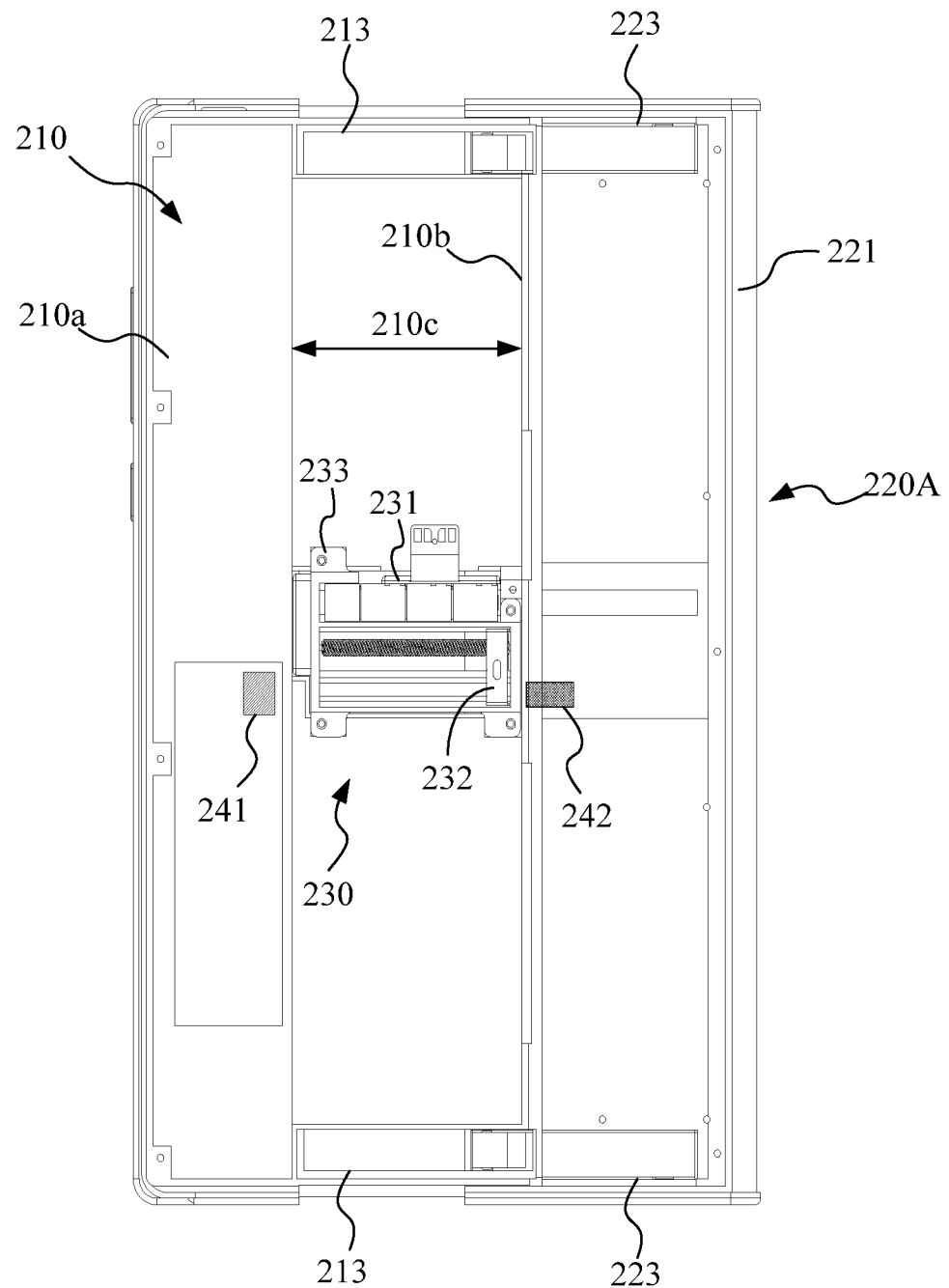
FIG. 3 is a schematic structural diagram in which a movable member and a housing are assembled according to an exemplary embodiment.

FIG. 3 is a schematic structural diagram in which a movable member and a housing are assembled according to an exemplary embodiment. As illustrated in FIG. 3, the telescopic driving mechanism 200 further includes a driving mechanism 230. The driving mechanism 230 has a first end coupled to the housing 210 and a second end coupled to the movable member 220A. The driving mechanism 230 is configured to drive the movable member 220A to move towards or away from the housing 210.

The housing 210 is configured to be coupled to the first end 110 of the flexible display screen 100. In some embodiments, the housing 210 is configured as a middle frame of the electronic device. The housing 210 includes a first side 210a and a second side 210b arranged opposite to each other, with a spacing region 210c between the first and second sides 210a, 210b. The driving mechanism 230 is provided in the spacing region 210c and coupled to the first and second sides 210a, 210b.

The driving mechanism 230 includes a driving portion 231, a movable portion 232 and a support 233. The driving portion 231 is coupled to the housing 210. For example, the support 233 is coupled to the housing 210, and the driving portion 231 is mounted to the support 233. The movable portion 232 is drivingly coupled to the driving portion 231, and is movable relative to the driving portion 231. In this way, the movable portion 232 has a moving stroke away from or towards the housing 210 under the driving action of the driving portion 231.

Figure 4:
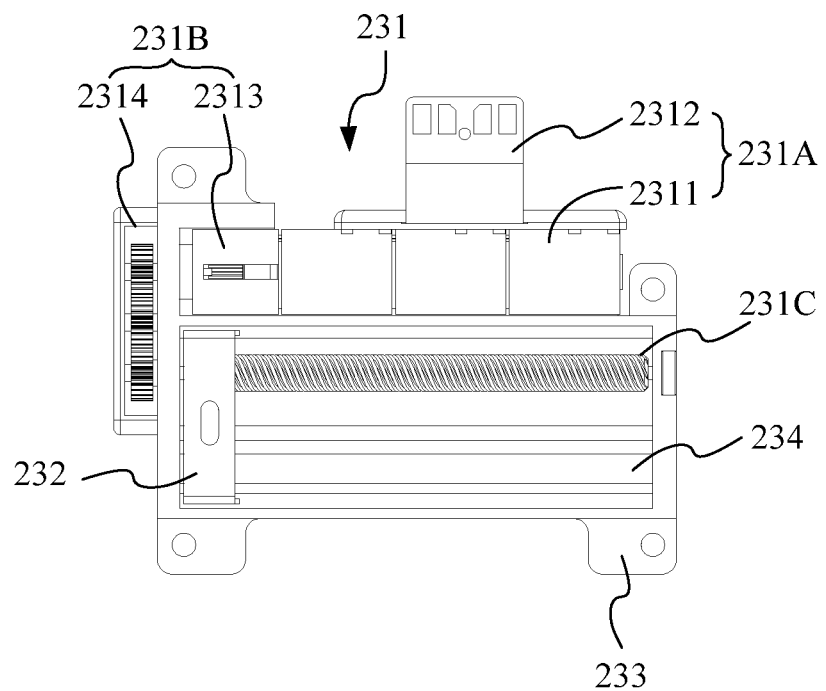
FIG. 4 is a schematic structural diagram of a driving mechanism according to an exemplary embodiment.

In some embodiments, FIG. 4 is a schematic structural diagram of a driving mechanism 230 according to an exemplary embodiment. As illustrated in FIG. 4, the driving portion 231 includes a driving assembly 231A, a speed reduction member 231B, and a transmission member 231C.

The driving assembly 231A includes at least one driving motor 2311 and a circuit board 2312 electrically coupled to the driving motor 2311. The circuit board 2312 is configured to electrically couple the driving motor 2311 to a control assembly (for example, a control chip), so as to realize controllable arrangement of the driving motor 2311. The driving motor 2311 may employ a direct current (DC) stepping motor. At this point, the driving motor 2311 converts an electric pulse signal into angular displacement or linear displacement. At this point, the driving motor 2311 is controlled to rotate by a fixed angle in a set direction by the pulse signal, and the angular displacement is controlled by controlling the number of the pulses, thereby achieving a purpose of accurate positioning. Meanwhile, a rotating speed and acceleration of the driving motor 2311 are controlled by controlling a pulse frequency, thereby achieving purposes of speed regulation and rotational torque output.

The speed reduction member 231B is coupled to the driving assembly 231A. In some embodiments, the speed reduction member 231B is fixedly coupled to an output shaft of the driving motor 2311. The speed reduction member 231B is also coupled to the transmission member 231C for effecting rotation of the transmission member 231C at a rotating speed lower than a rotating speed directly output by the driving assembly 231A. In some embodiments, the speed reduction member 231B includes a first speed reduction unit 2313 and a second speed reduction unit 2314 meshed with each other. Two-stage speed reduction is achieved by the first and second speed reduction units 2313, 2314 to convert low torque of the driving assembly 231A into high torque.

Figure 5:
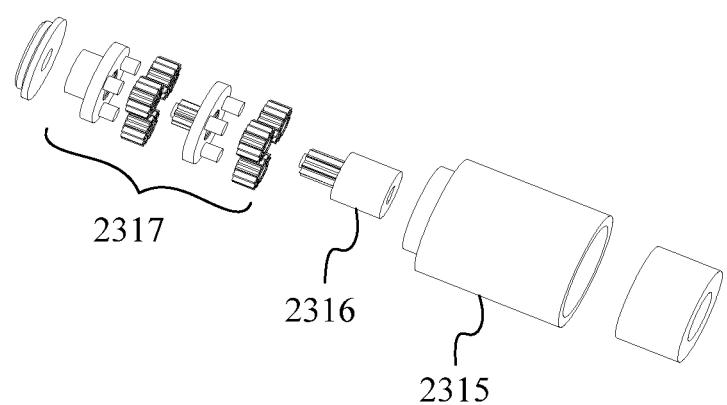
FIG. 5 is an exploded view of a first speed reduction unit in a speed reduction member according to an exemplary embodiment.

FIG. 5 is an exploded view of a first speed reduction unit in a speed reduction member according to an exemplary embodiment. As illustrated in FIG. 5, the first speed reduction unit 2313 includes a fixed member 2315, as well as a motor gear 2316 and a reduction gear assembly 2317 mounted in the fixed member 2315.

Referring to FIG. 4 on the basis of FIG. 5, the fixed member 2315 includes, but not limited to, a gear fixing ring, and an outer housing of the first speed reduction unit 2313 is formed by the gear fixing ring. The motor gear 2316 has a first end directly and fixedly coupled to the driving motor 2311, and a second end provided with a transmission gear which is meshed with the reduction gear assembly 2317. The reduction gear assembly 2317 serves as a core component of the first speed reduction unit 2313, and is configured to achieve rotational adjustment. In the embodiments of the present disclosure, the reduction gear assembly 2317 includes, but not limited to, at least one planetary gear. Also, the reduction gear assembly 2317 is coupled to the second speed reduction unit 2314. Furthermore, a bushing is provided between the motor gear 2316 and the driving motor 2311, and a bushing is provided between the reduction gear assembly 2317 and the second speed reduction unit 2314.

In this way, the driving motor 231A drives the motor gear 2316 to rotate, the motor gear 2316 drives the reduction gear assembly 2317 to rotate, and then, the reduction gear assembly 2317 drives the second speed reduction unit 2314 to rotate, so as to drive the transmission member 231C.

With continued reference to FIG. 4, the transmission member 231C is coupled to the speed reduction member 231B and is configured to be drivingly coupled to the movable portion 232. In some embodiments, the transmission member 231C is configured as a lead screw meshed with the speed reduction member 231B, and is rotatably coupled to the support 233. In this case, the speed reduction member 231B is driven to rotate relative to the support 233 by the transmission member 231C. At this point, the movable portion 232 is fitted over the transmission member 231C and coupled to the transmission member 231C by a thread. Furthermore, the driving mechanism 230 further includes a guide portion 234 provided parallel to the transmission member 231C, and the movable portion 232 is further fitted over the guide portion 234. The guide portion 234 limits the movable portion 232 to move linearly along the guide portion 234, such that the movable portion 232 drives the movable member 220A to move linearly.

Figure 6:
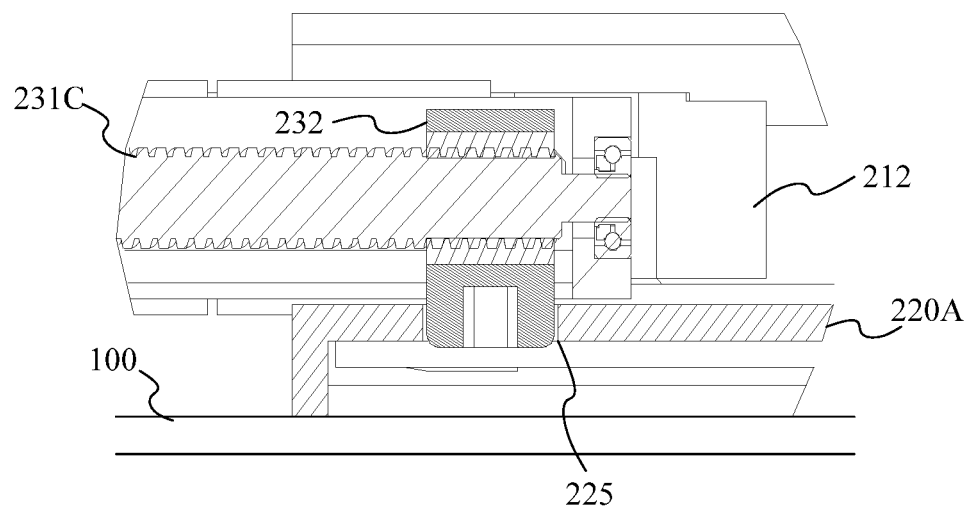
FIG. 6 is a partial sectional view of a housing and a movable member according to an exemplary embodiment.

With continued reference to FIG. 3, the movable member 220A is coupled to the movable portion 232 in the driving mechanism 230. FIG. 6 is a partial sectional view of a housing and a movable member according to an exemplary embodiment. As illustrated in FIG. 6, the movable member 220A is provided with a slot 225, and the movable portion 232 is inserted into the slot 225. Accordingly, the movable member 220A and the movable portion 232 maintain synchronous linear movement.

Also, the movable member 220A is coupled to the flexible display screen 100, e.g., directly, or by other mechanisms. The movable member 220A is configured to drive the second end 120 of the flexible display screen 100 to move away from or towards the first end 110 of the flexible display screen 100 by the driving mechanism 230.

The movable member 220A abuts against the part of the flexible display screen 100 corresponding to the side surface 130 of the electronic device. In addition, the movable member 220A is coupled to the second end 120 of the flexible display screen 100. For example, the movable member 220A is directly coupled to the second end 120 of the flexible display screen 100. Or, the electronic device further includes a telescopic assisting mechanism. The telescopic assisting mechanism is coupled to the movable member 220A and movably coupled to the second end 120 of the flexible display screen 100. An elastic member is provided in the telescopic assisting mechanism, and when the second end 120 moves away from the first end 110, the elastic member is extended to apply an acting force for retraction of the second end 120.

In this way, when the movable member 220A is driven by the driving mechanism 230 to drive the second end 120 of the flexible display screen 100 to move away from the first end 110 of the flexible display screen 100, the flexible display screen 100 is in the extended state. When the movable member 220A is driven by the driving mechanism 230 to drive the second end 120 of the flexible display screen 100 to move towards the first end 110 of the flexible display screen 100, the flexible display screen 100 is in the retracted state. Accordingly, the flexible display screen 100 may be extended and retracted by the telescopic driving mechanism, and then, different usage forms of the electronic device may be switched.

Figure 7A:
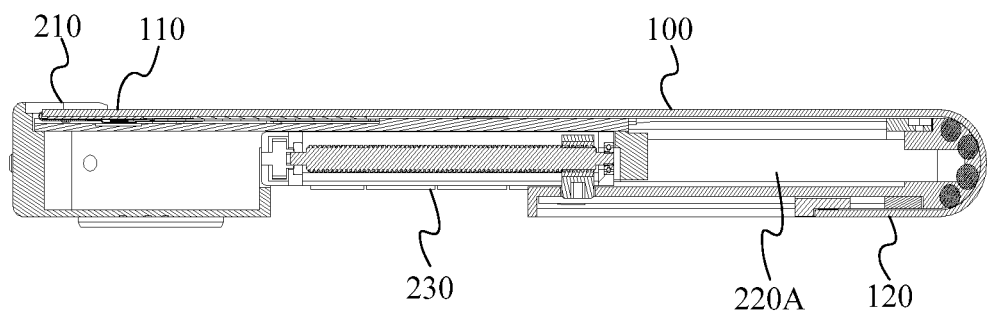
FIGS. 7a and 7b are sectional views of an electronic device according to different exemplary embodiments.
Figure 7B:
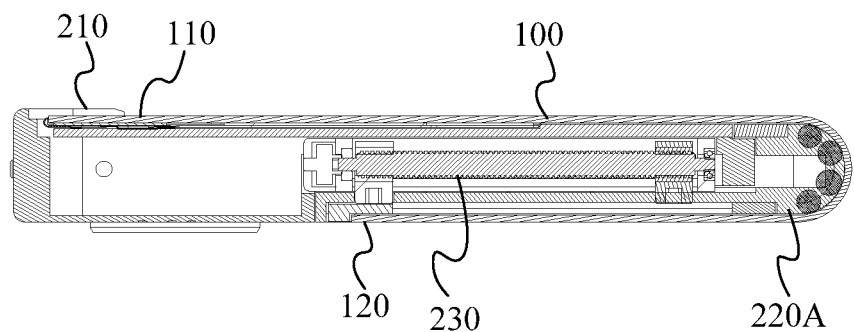
Figure 8:
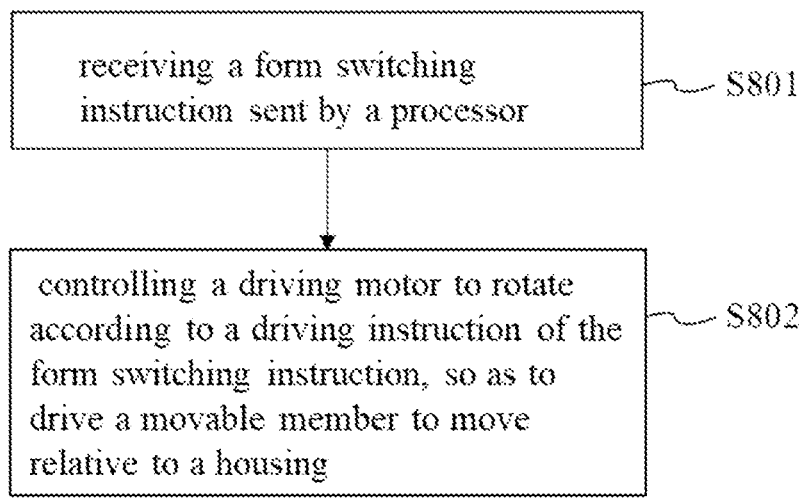
FIG. 8 is a motion flow chart of a driving mechanism according to an exemplary embodiment.

FIGS. 7a and 7b are sectional views of an electronic device according to different exemplary embodiments. As illustrated in FIGS. 7a and 7b, the housing 210 is fixedly coupled to the first end 110 of the flexible display screen 100. For example, the first end 110 is fixed at a supporting portion 211 of the housing 210 by a screen edge pressing strip. FIG. 8 is a motion flow chart of a driving mechanism according to an exemplary embodiment.

The driving mechanism 230 is also electrically coupled to a processor in the electronic device by a circuit board. With reference to FIGS. 7a, 7b and 8, the driving assembly 231A in the driving mechanism 230 serves as an executing body, and the driving mechanism 230 has the following motion process:

At block S801: receiving a form switching instruction sent by the processor.

The form switching instruction includes an extension instruction for switching to the extended form and a retraction instruction for switching to the retracted form.

At block S802: controlling the driving motor to rotate according to a driving instruction of the form switching instruction, so as to drive the movable member to move relative to the housing.

When the extension instruction is received, the control chip in the driving assembly 231A controls the driving motor 2311 to rotate in a first direction. Then, the driving motor 2311 drives the transmission member 231C to rotate by the speed reduction member 231B. At this point, the movable portion 232 has a tendency to move linearly while rotating relative to the transmission member 231C under the rotation action of the transmission member 231C. The movable portion 232 is further fitted over the guide portion 234, thus limiting circular motion of the movable portion 232. Then, the movable portion 232 is moved linearly in a forward direction along the transmission member 231C to drive the movable member 220A to move away from the housing 210.

Referring to FIG. 7a, the driving mechanism 230 drives the movable member 220A to apply an outward extension force to the part of the flexible display screen 100 corresponding to the side surface 130. The second end 120 of the flexible display screen 100 is moved away from the first end 110 to increase the size of the flexible display screen 100 at the front surface 110 of the electronic device, so as to achieve the extended form.

When the retraction instruction is received, the control chip in the driving assembly 231A controls the driving motor 2311 to rotate in a second direction opposite to the first direction. Then, the driving motor 2311 drives the transmission member 231C to rotate by the speed reduction member 231B. At this point, under the combined action of the transmission member 231C and the guide portion 234, the movable portion 232 is moved linearly in a reverse direction along the transmission member 231C to drive the movable member 220A to move towards the housing 210.

Referring to FIG. 7b, the driving mechanism 230 drives the movable member 220A to apply an inward retraction force to the part of the flexible display screen 100 corresponding to the side surface 130. At this point, the second end 120 of the flexible display screen 100 is moved towards the first end 110 to reduce the size of the flexible display screen 100 at the front surface 110 of the electronic device, so as to achieve the retracted form.

Furthermore, in an embodiment, the telescopic driving mechanism further includes a distance detecting assembly. The distance detecting assembly includes an emitting member 241 and a receiving member 242. One of the emitting member 241 and the receiving member 242 is provided at the housing 210, and the other is provided at the movable member 220A. Accordingly, a distance between the housing 210 and the movable member 220A may be detected by the distance detecting assembly, so as to determine an extension and retraction condition of the flexible display screen 100. The distance detecting assembly includes, but not limited to, an optical distance detecting assembly (for example, an infrared distance sensor) and a magnetic field detecting assembly (for example, a hall sensor).

When the electronic device is switched to the extended form, in response to the distance detecting assembly detecting that the distance between the housing 210 and the movable member 220A reaches a first set threshold, the control chip of the electronic device controls the driving motor 2311 to stop. The movable member 220A is prevented from further extending the flexible display screen 100 by the stop, so as to guarantee structural safety of the flexible display screen 100.

When the electronic device is switched to the retracted form, in response to the distance detecting assembly detecting that the distance between the housing 210 and the movable member 220A reaches a second set threshold, the control chip of the electronic device controls the driving motor 2311 to stop. The movable member 220A is prevented from further moving towards the housing 210 by the stop, so as to guarantee structural safety of the electronic device.

In an embodiment, the housing 210 is fixedly coupled to the first end 110 of the flexible display screen 100. In some embodiments, the housing 210 includes a supporting portion 211, and a lateral side 212 coupled to the supporting portion 211. In this way, the lateral side 211 forms an outer edge of the electronic device, and the supporting portion 211 is located inside the electronic device for bearing or mounting a functional module inside the electronic device. As illustrated in FIG. 1, the supporting portion 211 has a rectangular plate-shaped structure, and the lateral side 212 is provided around three sides of the supporting portion 211.

Figure 9:
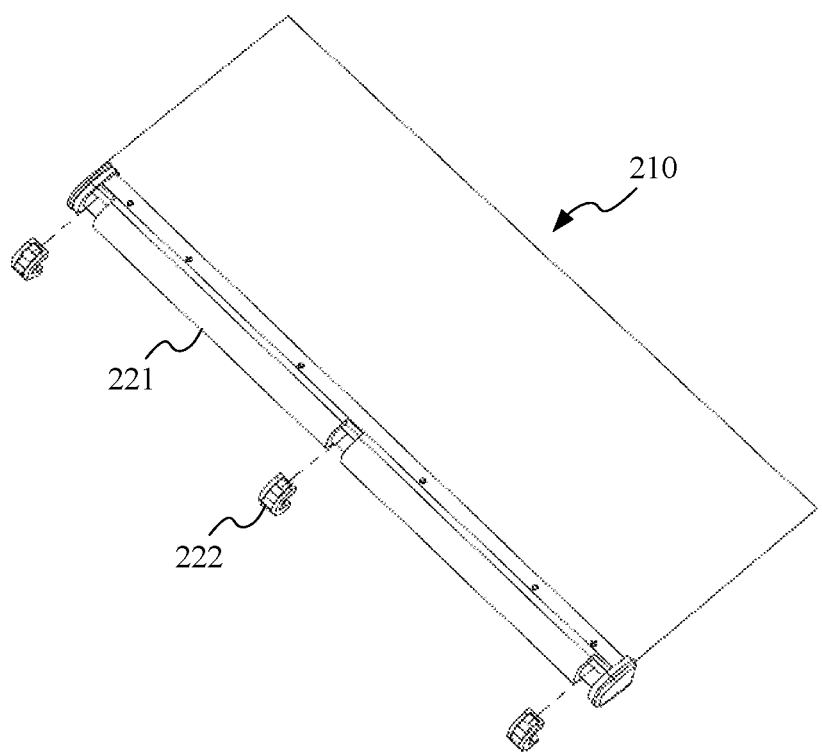
FIG. 9 is a schematic structural diagram of a housing and a movable member according to an exemplary embodiment.

FIG. 9 is a schematic structural diagram of a housing and a movable member according to an exemplary embodiment. As illustrated in FIG. 9, the movable member 220A includes a cambered side portion 221 configured to abut against the flexible display screen 100. The cambered side portion 221 abuts against the flexible display screen 100, such that on the one hand, the flexible display screen 100 may be conveniently slid relative to the movable member 220A, and on the other hand, the structural safety of the flexible display screen 100 is protected.

Further, a first transmission member 222 is provided at the cambered side portion 221, and is rollingly coupled to the flexible display screen 100. A frictional force between the flexible display screen 100 and the movable member 220A is further reduced by the rolling coupling. In some embodiments, the first transmission member 222 is configured as a ball connector provided at the cambered side portion 221, and a ball of the first transmission member 222 directly contacts the flexible display screen. The number of the first transmission members 222 is not particularly limited, and may be, for example, 2, 3, 4, or the like. When at least two first transmission members 222 are provided at the cambered side portion 221, the at least two first transmission members 222 are uniformly distributed along a length direction of the cambered side portion 221.

Figure 10:
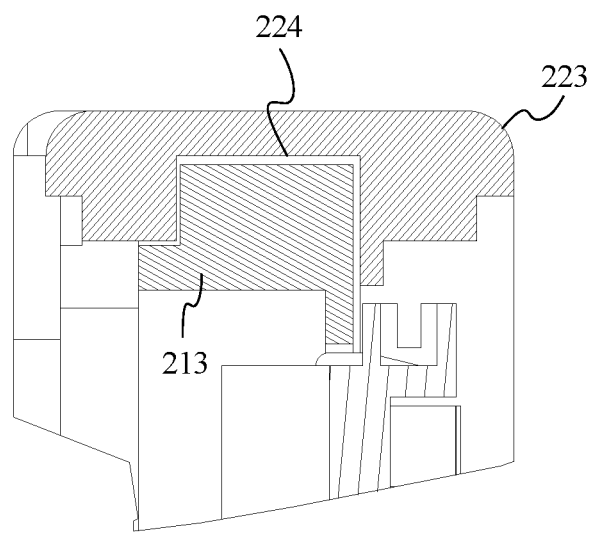
FIG. 10 is a schematic structural diagram of a housing and a movable member according to another exemplary embodiment.

In some embodiments, referring to FIG. 3 again, the housing 210 further includes a guide member 213 coupled to the first and second sides 210a, 210b. The movable member 220A includes a coupling portion 223 provided at the cambered side portion 221. The guide member 213 is movably coupled to the coupling portion 223 for limiting movement of the movable member 220A along the guide member 213. FIG. 10 is a partial sectional view of a housing and a movable member according to another exemplary embodiment. Referring to FIG. 10, a slot 224 is provided along a length direction of the coupling portion 223, and the guide member 213 is fitted in the slot, thereby realizing movable coupling of the movable member 220A and the housing 210.

2. Structure of the Telescopic Elastic Member 220B

Figure 11:
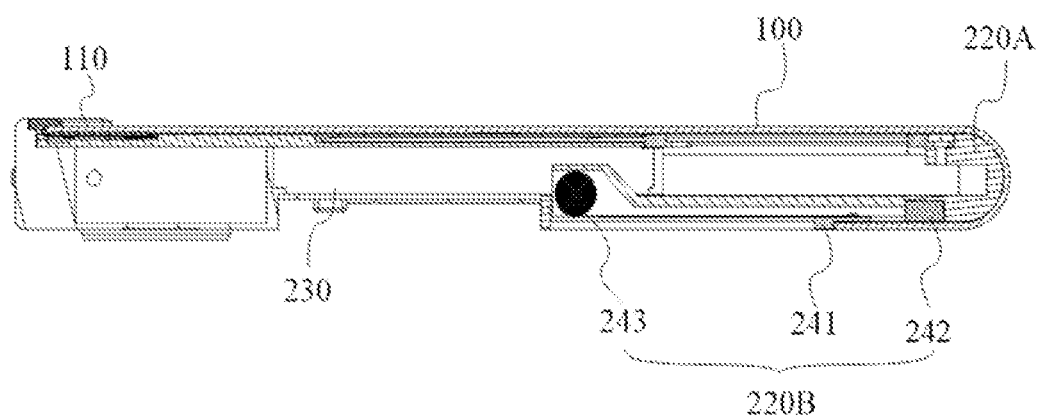
FIG. 11 is a sectional view of a telescopic elastic member in an electronic device according to an exemplary embodiment.
Figure 12A:
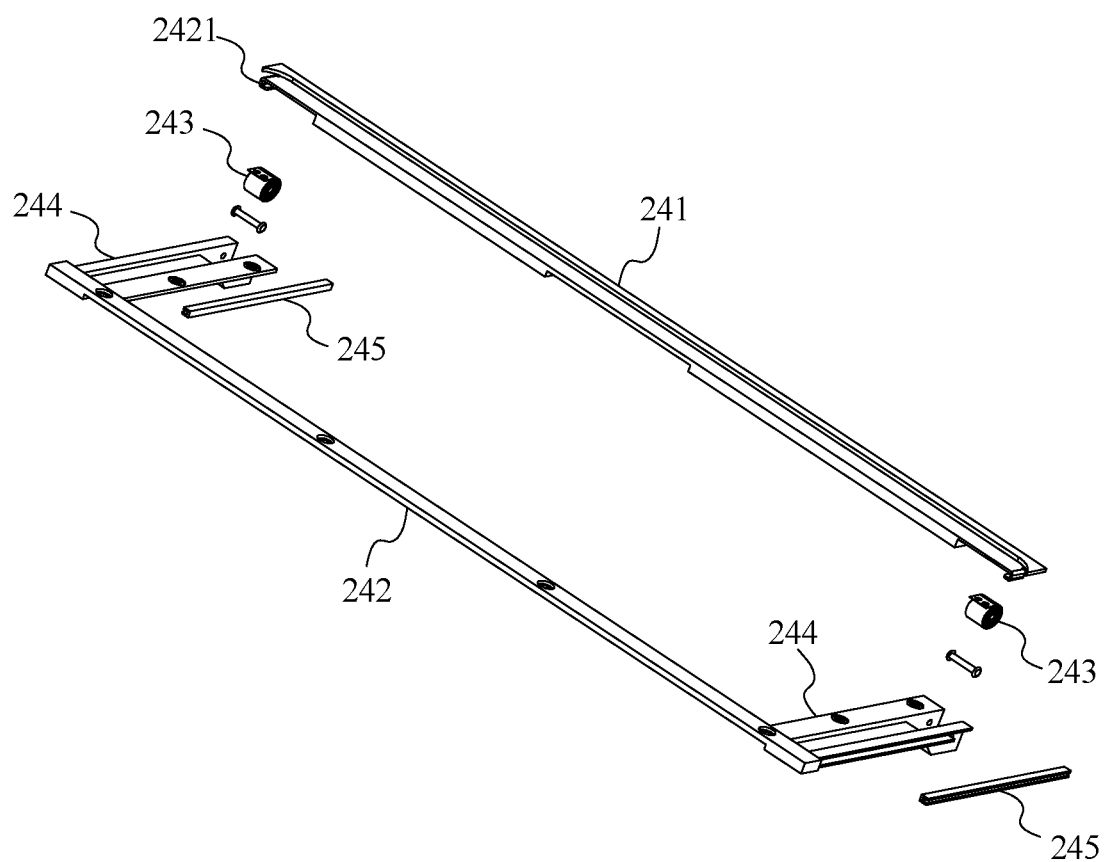
FIG. 12a is an exploded view of a telescopic elastic member according to an exemplary embodiment.
Figure 12B:
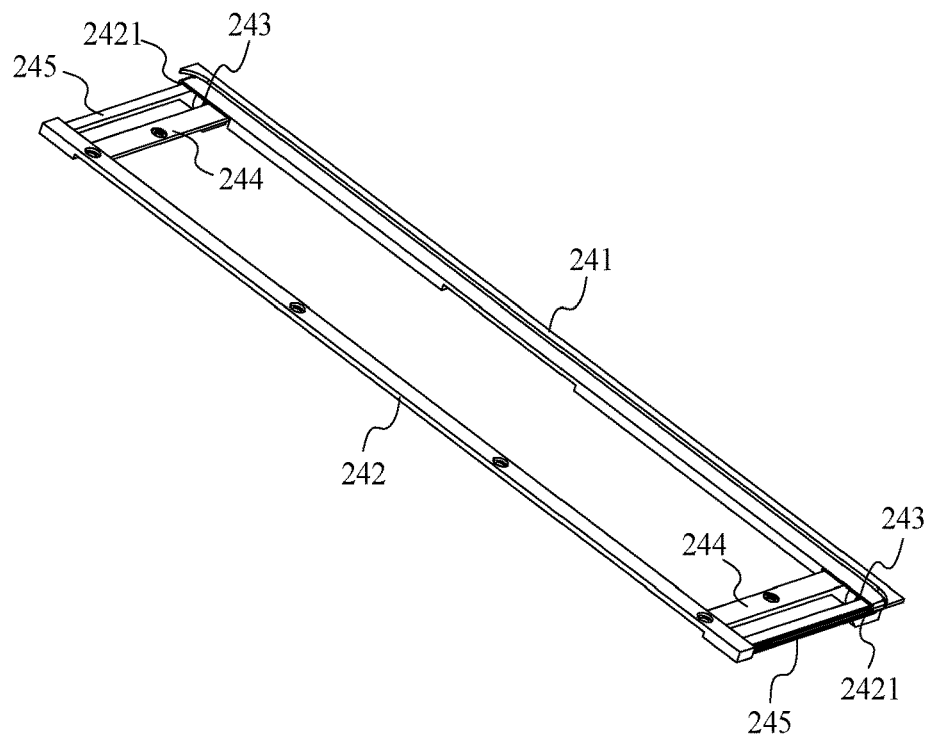
FIG. 12b is a schematic diagram of a telescopic elastic member according to an exemplary embodiment.

FIG. 11 is a sectional view of a telescopic elastic member in an electronic device according to an exemplary embodiment, FIG. 12a is an exploded view of a telescopic elastic member according to an exemplary embodiment, and FIG. 12b is a schematic diagram of a telescopic elastic member according to an exemplary embodiment.

As illustrated in FIG. 11, the telescopic elastic member 220B is provided in the electronic device. Referring to FIGS. 12a and 12b, the telescopic elastic member includes a sliding member 241, a support 242 and an elastic member 243.

The sliding member 241 is coupled to the flexible display screen 100 located at the rear surface of the electronic device. For example, the sliding member 241 is provided with an adhesive, and coupled to a surface of the flexible display screen 100 facing an inside of the electronic device with the adhesive. In this case, when the flexible display screen 100 is moved from the rear surface of the electronic device to the front surface of the electronic device, the flexible display screen 100 applies an acting force towards the side surface to the sliding member 241.

The support 242 is slidably coupled to the sliding member 241, and in at least one embodiment, the support 242 and the sliding member 241 are slid relatively in a direction perpendicular to the side surface of the electronic device. The support 242 is coupled to the movable member 220A, whereby the support 242 and the sliding member 241 are moved relatively as the movable member 220A is moved relative to the housing 110. For example, referring to FIGS. 12a and 12b, a guide member 245 is further provided at the support 242, and movably coupled to the sliding member 241, such that the sliding member 242 is slid along the guide member 245. Accordingly, the sliding member 242 is guaranteed to move stably relative to the support 242.

The guide member 245 is coupled to the support 242 by a fastener, or the guide member 245 and the support 242 are integrally formed. The guide member 245 is made of polyoxymethylene (POM), the POM has a self-lubricating function, and the guide member 245 made of this material may reduce friction between the guide member 245 and the sliding member 241.

A guide groove 2421 fitted with the guide member 245 is provided in the sliding member 242, for example, in FIG. 12b, the guide member 245 is provided with a laterally opened guide groove 2421. The guide groove 2421 is configured for insertion of the guide member 245. In the embodiments of the present disclosure, the arrangement of the guide groove 2421 is not limited, as long as the guide groove may be fitted with the guide member 245. Certainly, it is also possible to provide a projecting key at the sliding member 241 and a guide groove fitted with the projecting key in the guide member 245, and the guide groove is configured for insertion of the projecting key.

Figure 13A:
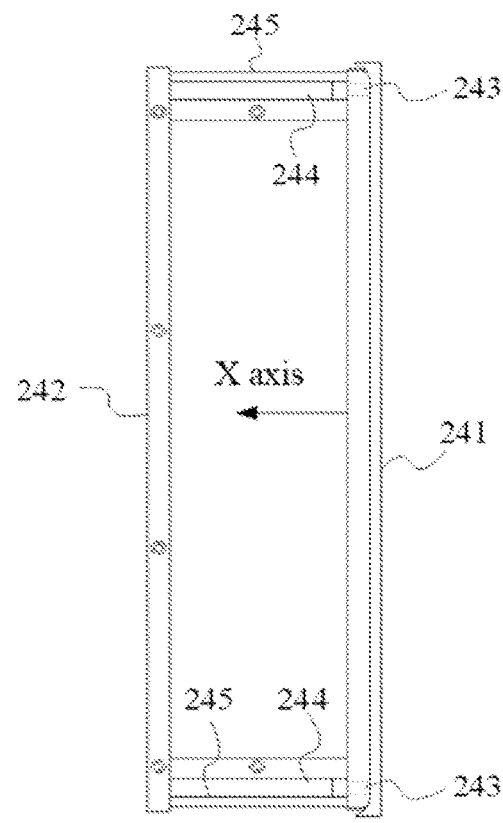
FIGS. 13a and 13b are schematic diagrams of a telescopic elastic member in different use states according to an exemplary embodiment.
Figure 13B:
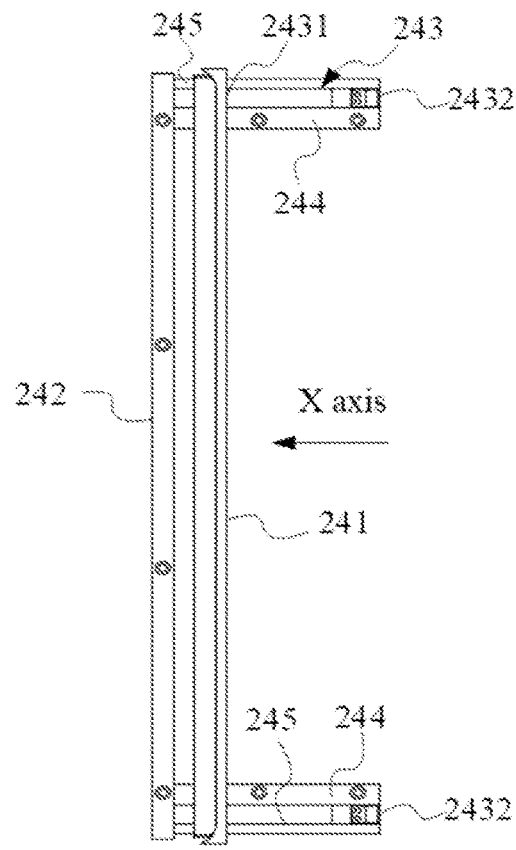

FIGS. 13a and 13b are schematic diagrams of a telescopic elastic member in different use states according to an exemplary embodiment. Based on FIG. 10, referring to FIGS. 13a and 13b, the sliding member 241 may be moved towards or away from the support 242 along an X axis. The support 242 is provided between the sliding member 241 and the side surface of the electronic device. In this case, the sliding member 241 may be slid towards the support 242 under the action of the flexible display screen 100.

The support 242 is configured to bear an acting force applied to the flexible display screen 100 by an external force and facing the side surface of the electronic device. A driving mechanism 230 is provided within the electronic device, coupled to the support 242 in the telescopic elastic member, and configured to drive the support 242 to move towards or away from the side surface. The movable member 220A also abuts against the part of the flexible display screen 100 corresponding to the side surface, and is fixedly coupled to the support 242 in the telescopic elastic member 220B.

In this case, referring to FIG. 13a, the support 242 is driven by the driving mechanism 230 to drive the movable member 220A to apply a pushing force in the positive direction of the X axis to the flexible display screen 100. Further, since the part of the flexible display screen 100 located at the front surface of the electronic device is fixed, the flexible display screen 100 has a tendency to move from the rear surface to the front surface under the action of the pushing force applied by the support 242. In this case, the flexible display screen 100 applies a force in the positive direction of the X axis to the sliding member 241, so as to drive the sliding member 241 to move towards the support 242. At this point, the end of the flexible display screen 100 located at the rear surface of the electronic device is moved to the side surface, such that the flexible display screen at the rear surface is turned to the front surface, and the size of the flexible display screen at the front surface of the electronic device is enlarged.

The elastic member 243 includes a first end 2431 and a second end 2432. The first end 2431 is coupled to the sliding member 241, and the second end 2432 is fixed relative to the support 242. In this way, the elastic member 243 is deformed as the sliding member 241 and the support 242 are relatively moved. The elastic member 243 is configured to apply an acting force for moving away from the side surface (i.e., an acting force in the negative direction of the X axis) to the sliding member 241, so as to drive the sliding member 241 to move away from the support 242 (as illustrated in FIG. 12b). The sliding member 241 is driven to move away from the support 242 by the elastic member 243, such that the sliding member 241 drives the flexible display screen 100 to be turned from the front surface of the electronic device to the rear surface of the electronic device, thus reducing the size of the flexible display screen 100 at the front surface of the electronic device.

In the embodiments of the present disclosure, the elastic member 243 has two arrangements, which are described in the following cases.

First Arrangement

Figure 14:
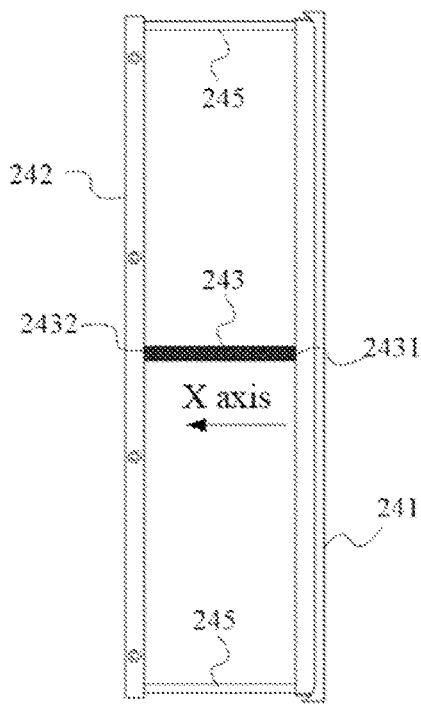
FIG. 14 is a schematic structural diagram of a telescopic elastic member according to another exemplary embodiment.

FIG. 14 is a schematic structural diagram of a telescopic elastic member according to another exemplary embodiment. As illustrated in FIG. 14, the elastic member 243 is provided between the sliding member 241 and the support 242, the first end 2431 is coupled to the sliding member 241, and the second end 2432 is directly coupled to the support 242.

When the sliding member 241 is driven by the flexible display screen 100 to move towards the support 241, the elastic member 243 is in a compressed state, and applies an acting force in the negative direction of the X axis to the sliding member 241. Meanwhile, the flexible display screen 100 applies an acting force in the positive direction of the X axis to the sliding member 241 by the support 242 driven by the driving mechanism 230. Based on the joint action of the flexible display screen 100 and the elastic member 243, the sliding member 241 is in a stationary stable state.

When the driving mechanism 230 drives the support 242 to retract, that is, drives the support 242 to move in the negative direction of the X axis, the force in the positive direction of the X axis applied to the sliding member 241 by the flexible display screen 100 is weakened. At this point, the elastic member 243 has a tendency to bounce, and the sliding member 241 may be driven to move away from the support 242. Then, the sliding member 241 drives the flexible display screen 100 to be turned from the front surface of the electronic device to the rear surface of the electronic device, thus reducing the size of the flexible display screen 100 at the front surface of the electronic device.

Second Arrangement

Figure 15A:
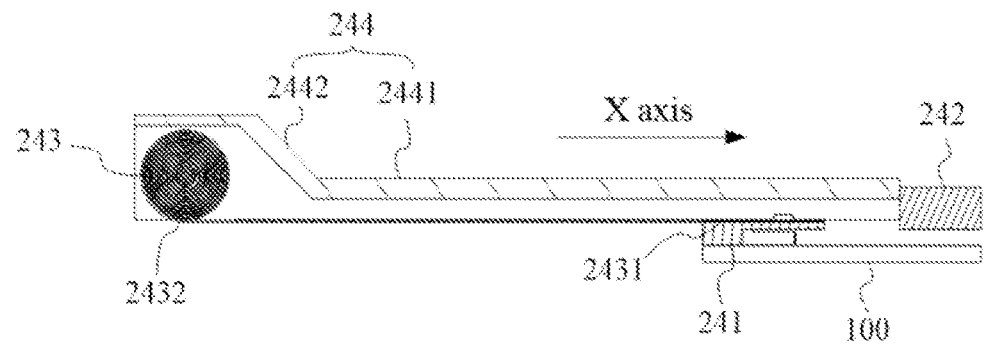
Figure 15B:
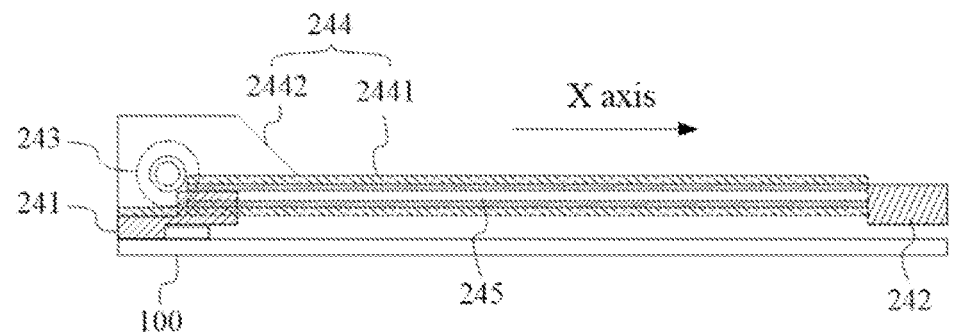
FIG. 15b is a sectional view of the telescopic elastic member illustrated in FIG. 13b.

FIG. 15a is a sectional view of the telescopic elastic member illustrated in FIG. 13a, and FIG. 15b is a sectional view of the telescopic elastic member illustrated in FIG. 13b. As illustrated in FIGS. 15a and 15b, the first end 2431 of the elastic member 243 and the sliding member 241 are provided on the same side of the support 242, and a set distance is kept between the first end 2431 and the support 242. At this point, the elastic member 243 is configured to be tensioned to apply a force to the sliding member 241.

In some embodiments, a mounting member 244 is provided at the support 242, and includes an extension portion 2441 and a mounting portion 2442. The extension portion 2441 is coupled to the support 242 and extends towards the sliding member 241. The mounting portion 2442 is coupled to a part of the extension portion 2441 away from the support 242, and configured to mount the second end 2432 of the elastic member 243. In this way, the set distance is kept between the first end 2431 of the elastic member 243 and the support 242 by the extension portion 2441.

With reference to FIGS. 15a and 13a, when the sliding member 241 is driven by the flexible display screen 100 to move towards the support 242, the elastic member 243 is in an extended state. At this point, the elastic member 243 applies an acting force in the negative direction of the X axis to the sliding member 241. Meanwhile, the flexible display screen 100 applies an acting force in the positive direction of the X axis to the sliding member 241 by the support 242 driven by the driving mechanism 230. Based on the joint action of the flexible display screen 100 and the elastic member 243, the sliding member 241 is in a stationary stable state.

Referring to FIGS. 15b and 13b, when the driving mechanism 230 drives the support 242 to retract, that is, drives the support 242 to move in the negative direction of the X axis, the force in the positive direction of the X axis applied to the sliding member 241 by the flexible display screen 100 is weakened. At this point, the elastic member 243 has a tendency to retract, and the sliding member 241 may be driven to move away from the support 242. Then, the sliding member 241 drives the flexible display screen 100 to be turned from the front surface of the electronic device to the rear surface of the electronic device, thus reducing the size of the flexible display screen 100 at the front surface of the electronic device.

Further, the embodiments of the present disclosure provide an implementation of the mounting member.

Figure 16:
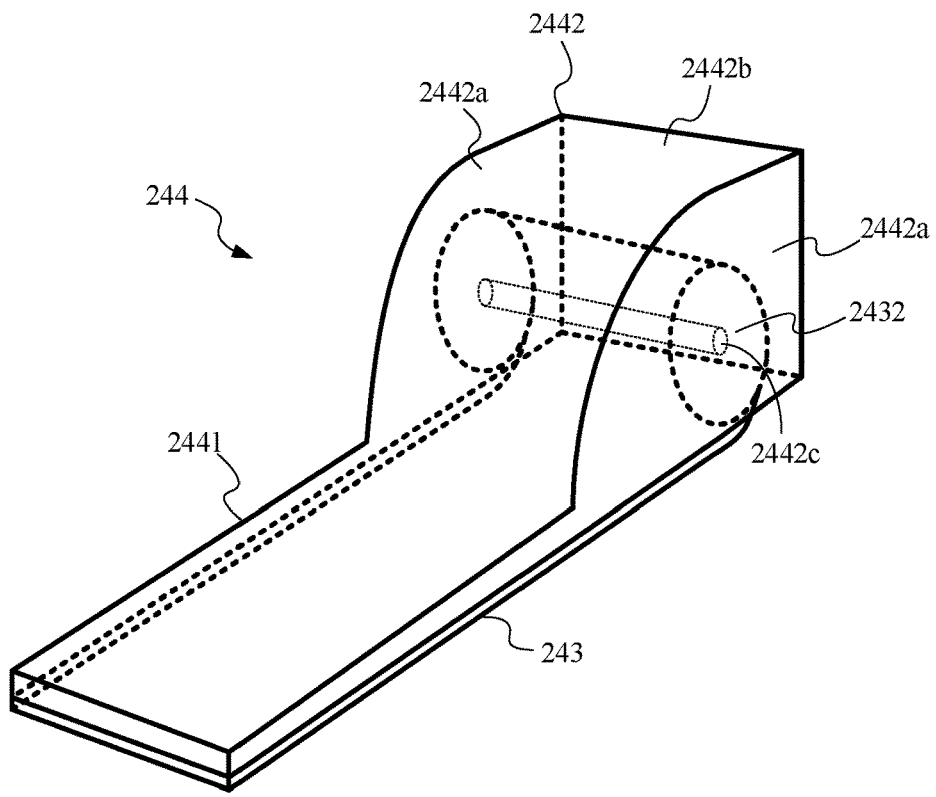
FIG. 16 is a schematic structural diagram of a mounting member in a telescopic elastic member according to an exemplary embodiment.

FIG. 16 is a schematic structural diagram of a mounting member in a telescopic elastic member according to an exemplary embodiment. As illustrated in FIG. 16, the mounting portion 2442 includes a side wall 2442a coupled to the extension portion 2441, and the side wall 2442a extends towards the front surface of the electronic device. In some embodiments, the mounting portion 2442 includes oppositely provided side walls 2442a and a top wall 2442b coupled to the side walls 2442a. A part of the top wall 2442b is coupled to a top of the side wall 2442a (i.e., the part of the side wall 2441a towards the front surface), and another part of the top wall 2442b is inclined towards the rear surface of the electronic device and extends downwards to be coupled to the extension portion 2441.

In this way, the mounting portion 2442 forms a cavity protruding towards the front surface of the electronic device, and the elastic member 243 is mounted in the cavity. In this way, structural safety of the elastic member 243 is secured by the mounting portion 2442.

A supporting member 2442c is provided at the side wall 2442a, and is parallel to the front surface of the electronic device. The second end 2432 of the elastic member 243 is coupled to the supporting member 2442c, and the elastic member 243 is wound around the supporting member 2442c. When extended and retracted by the sliding member 241, the elastic member 243 is rotated about the supporting member 2442c. In other words, the elastic member 243 is configured as an elastic piece wound around the supporting member 2442c. In some embodiments, the thickness of the elastic piece is 0.03 mm-1 mm. In some embodiments, the elastic member 243 is configured as a volute spiral spring.

In this way, a space occupied by the elastic member 243 is reduced, and particularly, the extended portion of the elastic member 243 has a sheet-like shape, and occupies a small space due to its small thickness. In this way, on the one hand, influences of the elastic member 243 on other assemblies in the telescopic elastic member are reduced, and on the other hand, a volume of the entire telescopic assisting mechanism is reduced, thus facilitating the arrangement of the mechanism in the electronic device.

In some embodiments, referring to FIG. 11, at least two mounting members 244 are provided at the support 242, and the elastic member 243 is provided in each mounting member 244. For example, the two mounting members 244 are provided at two ends of the support 242. In this way, a stable acting force is applied to the sliding member 241 by the elastic members 243 in the two mounting members 244, thus ensuring that the sliding member 241 is stably moved relative to the support 242.

In some embodiments, the elastic member 243 is configured as a constant force spring. After a deformation stroke of the constant force spring reaches a set value, the elastic force of the constant force spring is kept constant along with an increase of the deformation stroke. In this way, as the sliding member 241 continuously moves towards the support 242, when extension and retraction strokes of the elastic member 243 exceed a set value, the elastic member 243 applies a constant tensile force to the sliding member 241. In this case, a load of driving the sliding member 241 by the flexible display screen 100 may be reduced, and then, a load of driving the flexible display screen 100 by the driving mechanism 230 through the support 242 may be reduced.

Based on the above, the overall solution of the telescopic driving mechanism 200 in the embodiments of the present disclosure is explained.

Figure 17A:
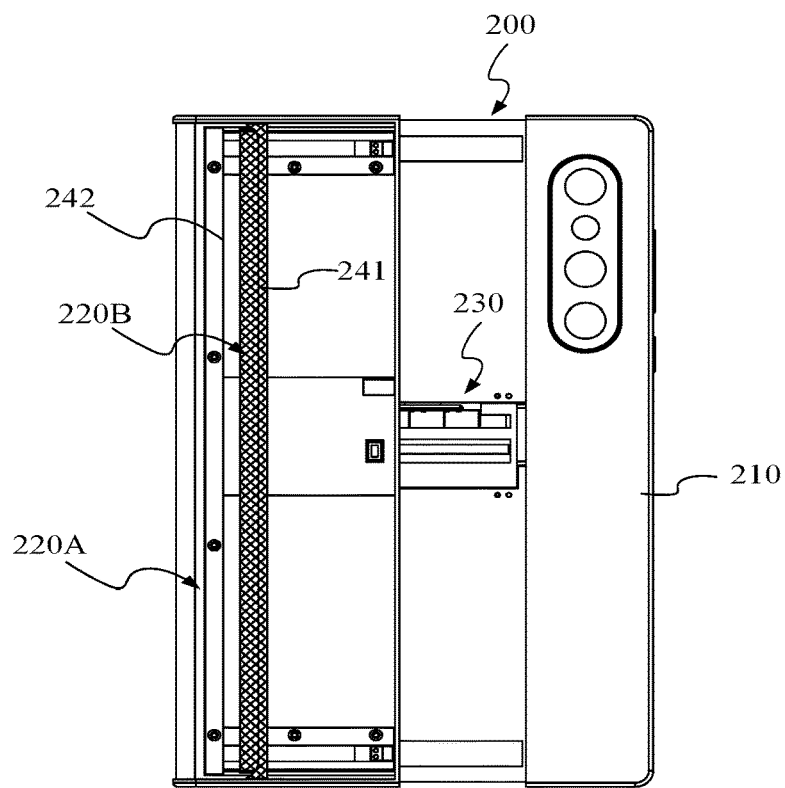
FIGS. 17a and 17b are schematic diagrams of a telescopic driving mechanism in different forms according to an exemplary embodiment.
Figure 17B:
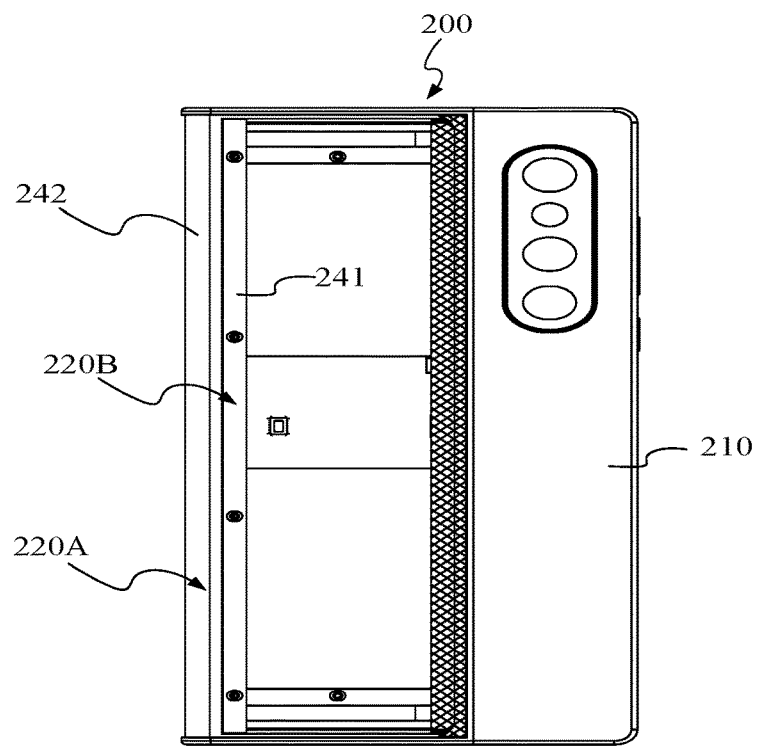

FIGS. 17a and 17b are schematic diagrams of a telescopic driving mechanism in different forms according to an exemplary embodiment. As illustrated in FIGS. 17a and 17b, in the telescopic driving mechanism 200, the telescopic elastic mechanism 220B is mounted to the movable member 220A. For example, the support 242 of the telescopic elastic mechanism 220B is coupled to the movable member 220A by a fastener. The telescopic driving mechanism 200 has the following working process.

With reference to FIGS. 7a and 17a, the process of switching the telescopic driving mechanism 200 to the extended form is as follows:

the driving mechanism 230 drives the movable member 220A to move away from the housing 210, so as to drive the support 242 coupled to the movable member 220A to apply an acting force towards the side surface to the flexible display screen 100. Accordingly, the flexible display screen 100 applies a tension force to the sliding member 241. At this point, the sliding member 241 is moved towards the support 242, such that the flexible display screen 100 is turned from the rear surface of the electronic device to the front surface of the electronic device. In the process that the sliding member 241 approaches the support 242, the elastic member 243 applies an acting force for moving away from the support 242 to the sliding member 241.

With reference to FIGS. 7b and 17b, the process of switching the telescopic driving mechanism 200 to the retracted form is as follows:

the driving mechanism 230 drives the movable member 220A to approach the housing 210, so as to drive the support 242 coupled to the movable member 220A to move away from the side surface, such that the force applied by the support 242 to the flexible display screen 100 is weakened. At this point, the sliding member 241 is driven to move away from the support 242 by the elastic member 243. Then, the sliding member 241 drives the flexible display screen 100 to be turned from the front surface of the electronic device to the rear surface.

In an embodiment, the electronic device according to the embodiments of the present disclosure further includes a protective shell, and an internal structure of the electronic device is prevented from being exposed in the extended form by the protective shell, thus guaranteeing the structural safety of the whole electronic device.

Figure 18:
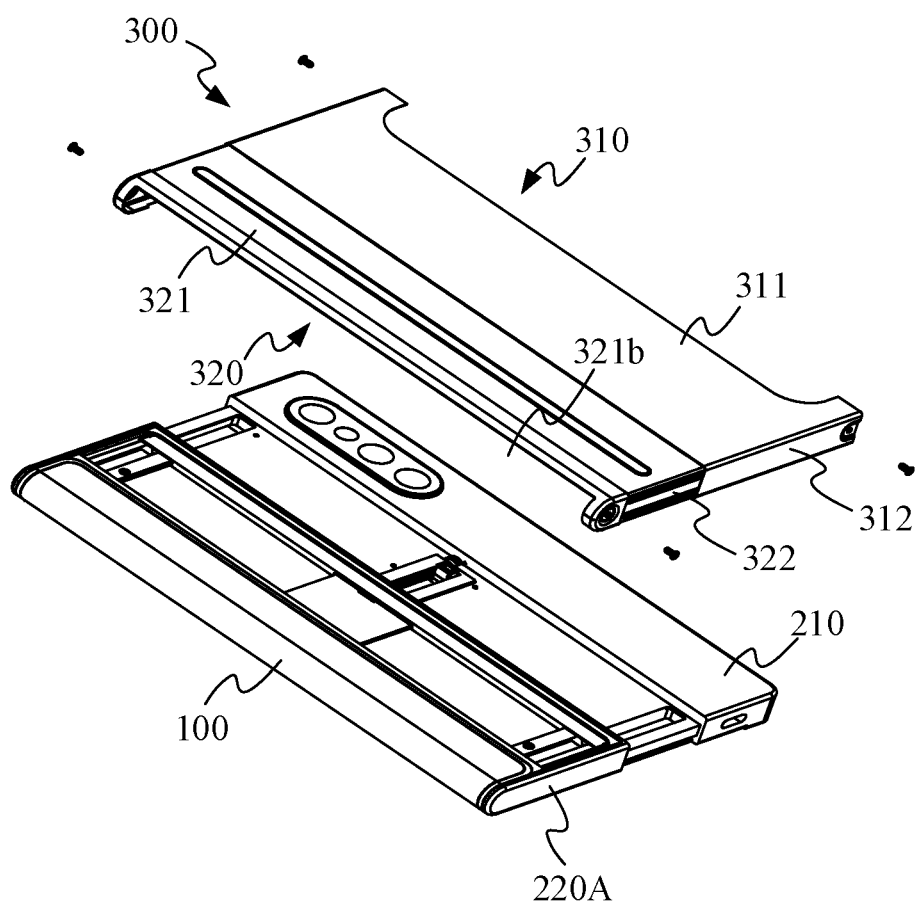
FIG. 18 is a schematic structural diagram of a protective shell according to an exemplary embodiment.
Figure 19A:
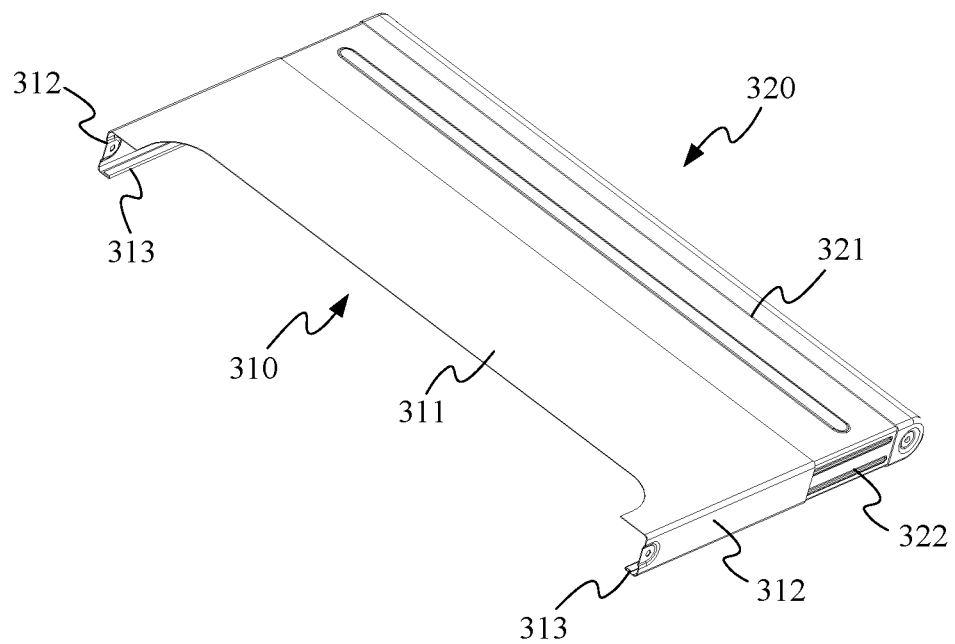
FIGS. 19a and 19b are schematic structural diagrams of a protective shell in different forms according to an exemplary embodiment.
Figure 19B:
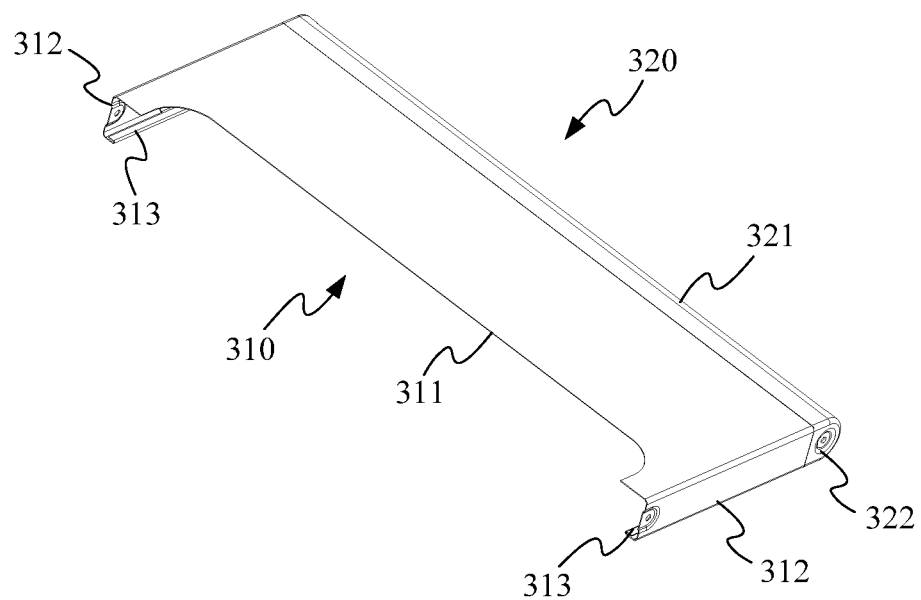

FIG. 18 is a schematic structural diagram of an electronic device according to another exemplary embodiment, and FIGS. 19a and 19b are schematic structural diagrams of a protective shell in different forms according to an exemplary embodiment.

As illustrated in FIG. 18, the electronic device according to the embodiments of the present disclosure further includes a protective shell 300. This protective shell 300 is provided at the rear surface of the electronic device, and in at least one embodiment includes a fixed portion 310 and a movable portion 320.

The fixed portion 310 is coupled to the housing 210. The movable portion 320 is provided on a side of the fixed portion 310 facing an inside or outside of the electronic device. The movable portion 320 is movably coupled to the fixed portion 310. The movable portion 320 is further configured to be coupled to the movable member 220A in the electronic device. Further, as the movable member 220A is moved relative to the housing 210, the movable portion 320 is moved away from or towards the fixed portion 310.

When moving away from the housing 210, the movable member 220A drives the movable portion 320 to move away from the fixed portion 310. At this point, as illustrated in FIG. 19a, an overall length of the protective shell 300 is increased to accommodate the extended form of the electronic device.

When moving towards the housing 210, the movable member 220A drives the movable portion 320 to move towards the fixed portion 310. At this point, as illustrated in FIG. 19b, the overall length of the protective shell 300 is reduced to accommodate the retracted form of the electronic device.

In this way, the protective shell 300 provides comprehensive protection in different use forms of the electronic device, so as to prevent the exposure of internal assemblies of the electronic device and ensure the structural safety and use safety of the whole electronic device.

In an embodiment, a part of the movable portion 320 is overlapped with a part of the fixed portion 310 in a state where the movable portion 320 is maximally displaced relative to the fixed portion 310. In other words, in the extended form, the movable portion 320 and the fixed portion 310 have overlapped parts. In this way, the protection effect of the protective shell is optimized, the internal assemblies of the electronic device are prevented from being exposed in the extended form, and the safety of the electronic device is guaranteed.

In the embodiments of the present disclosure, the fixed portion 310 and the movable portion 320 are laminated. Referring to an internal-external direction of the electronic device, for example, the fixed portion 310 is provided at an outer side the movable portion 320 for illustration in the following and the accompanying drawings. Certainly, the fixed portion 310 may be provided at an inner side of the movable portion 320 according to actual requirements.

Figure 20:
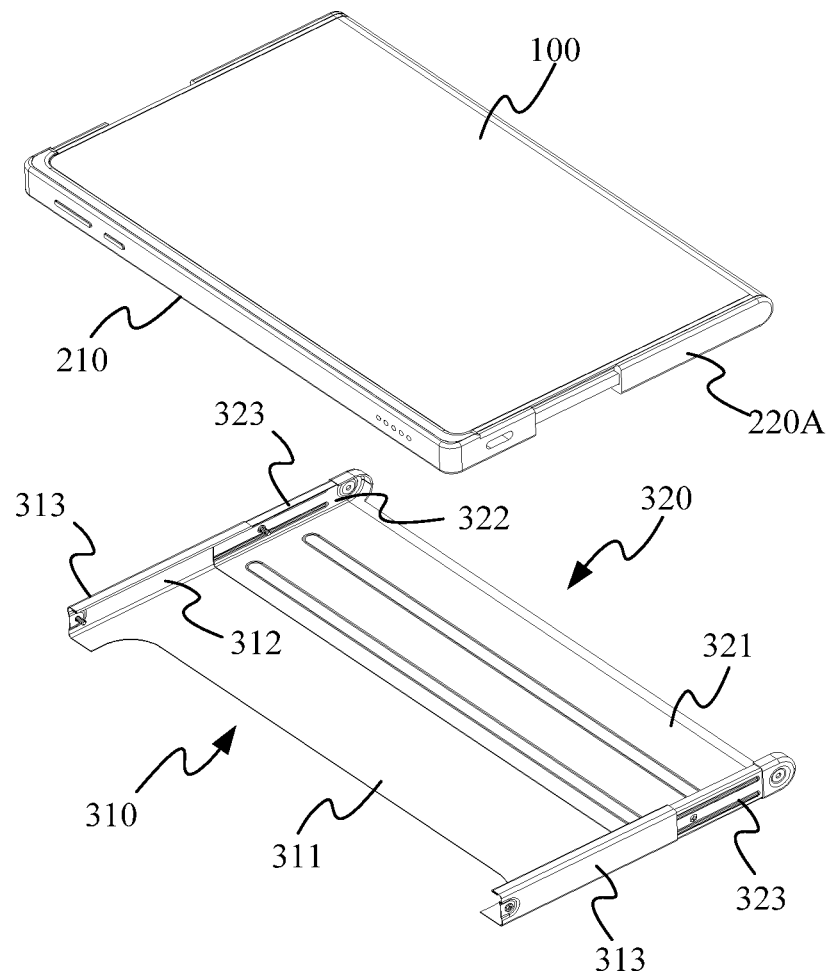
FIG. 20 is a schematic structural diagram of a protective shell from another perspective according to an exemplary embodiment.

FIG. 20 is a schematic structural diagram of a protective shell from another perspective according to an exemplary embodiment. Referring to FIGS. 18 and 20, the fixed portion 310 includes a first body 311 and a first side portion 312.

The first body 311 has a plate-shaped structure, and the first side portion 312 is coupled to an edge of the first body 311 and extends in a direction perpendicular to the first body 311. The first side portions 312 are provided at two opposite edges of the first body 311. The first body 311 is provided corresponding to the rear surface of the electronic device, and the first side portion 312 is provided at least corresponding to the side surface of the electronic device. Accordingly, the fixed portion 310 covers the rear surface and the side surface of the electronic device.

In some embodiments, a mounting location is provided at the first side portion 312 for mounting a fastener or an adhesive to couple the fixed portion 310 to the housing 210. Then, the fixed portion 310 and the housing 210 are kept relatively stable.

The movable portion 320 has a similar structure to the fixed portion 310. With continued reference to FIGS. 18 and 20, the movable portion 320 includes a second body 321 and a second side portion 322.

The second body 321 has a plate-shaped structure, and the second side portion 322 is coupled to an edge of the second body 321 and extends in a direction perpendicular to the second body 321. The second side portions 322 are provided at two opposite edges of the second body 321. The second body 321 is provided corresponding to the first body 311 of the fixed portion 310. The second side portion 322 is provided at least corresponding to the side surface of the electronic device.

Furthermore, a mounting location is provided at the second side portion 322 for mounting a fastener or an adhesive to couple the movable portion 320 to the movable member 220A. Then, the movable portion 320 and the movable member 220A are kept relatively stable.

Based on the above, when the movable member 220A is moved relative to the housing 210, the fixed portion 310 and the movable portion 320 are linearly moved relatively.

Figure 21A:
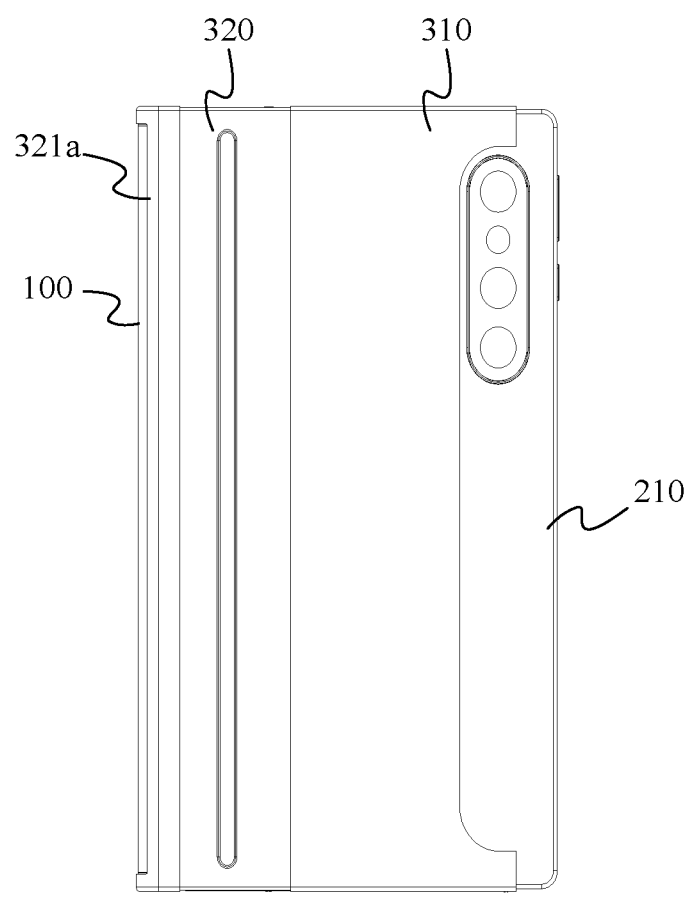
FIGS. 21a and 21b are schematic diagrams of an electronic device in different use forms according to an exemplary embodiment.
Figure 21B:
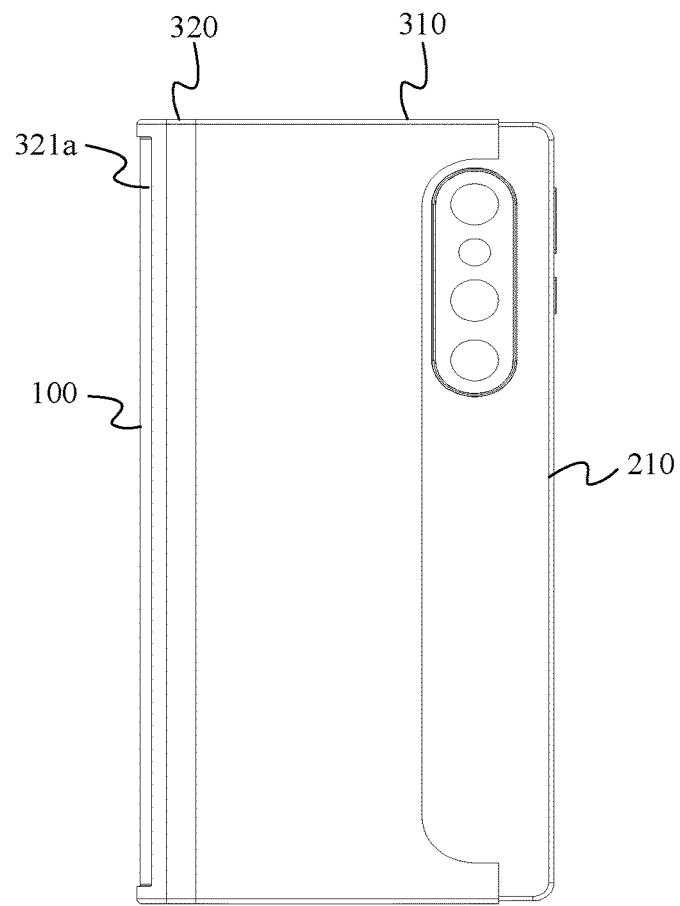

FIGS. 21a and 21b are schematic diagrams of an electronic device in different use forms according to an exemplary embodiment. The movable portion 320 is provided at the inner side of the fixed portion 310. In the retracted form, the mobile portion 320 is retracted within the fixed portion 310, as illustrated in FIG. 21a. At this point, the movable portion 320 is not visible from the outside of the electronic device. As illustrated in FIG. 21b, in the extended form, the movable portion 320 extends from the inside of the fixed portion 310, and at this point, the second side portion 322 of the movable portion 320 is provided corresponding to the extended side surface of the electronic device and partially staggered with the first side portion 312 of the fixed portion 310.

In this way, the rear and side surfaces of the electronic device are provided with comprehensive protection by the movable portion 320 and the fixed portion 310.

Furthermore, a first clamping side 313 is provided at a part of the first side portion 312 away from the first body 311. The first clamping side 313 is parallel to the first body 311 and is configured to be provided above the display screen of the electronic device. Exemplarily, a gap with a width of 0.05 mm to 0.3 mm is provided between the first clamping side 313 and the display screen. The display screen is provided with a deformation space by the reserved gap, and prevented from being wrinkled in the extended form by controlling a range of the gap.

A second clamping side 323 is provided at a part of the second side portion 322 away from the second body 321. The second clamping side 323 is parallel to the second body 321 and is configured to be provided above the display screen of the electronic device. Exemplarily, a gap with a width of 0.05 mm to 0.3 mm is provided between the second clamping side 323 and the display screen. The display screen is provided with the deformation space by the reserved gap, and prevented from being wrinkled in the extended and retracted forms by controlling the range of the gap.

Figure 22:
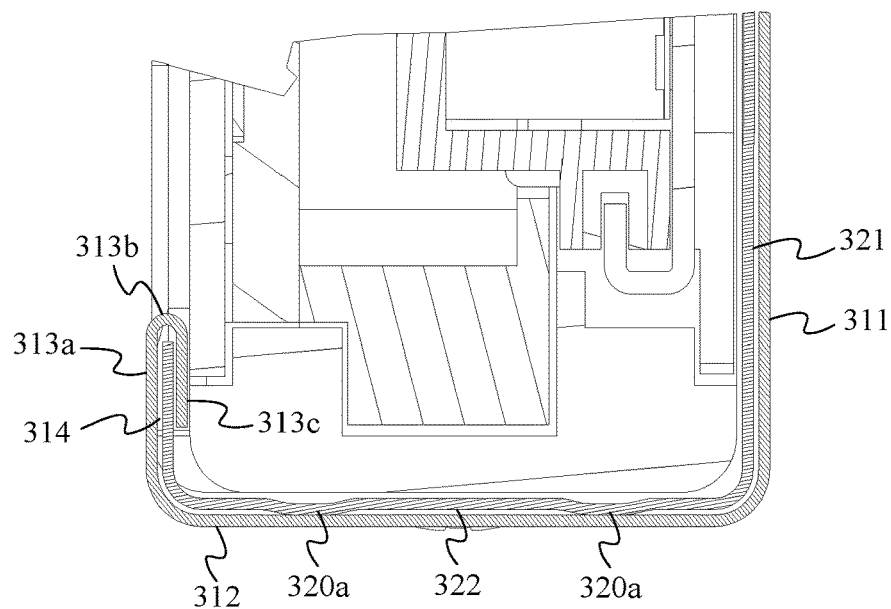
FIG. 22 is a sectional view of a protective shell according to an exemplary embodiment.

FIG. 22 is a sectional view of a protective shell according to an exemplary embodiment. As illustrated in FIG. 22, the first clamping side 313 of the fixed portion 310 is provided with a guide groove 314. The second clamping side 323 of the movable portion 320 is inserted into the guide groove 314. The movable portion 320 is moved relative to the fixed portion 310 along the length direction of the guide groove 314. The guide groove 314 has a guide effect to improve stability of the relative movement between the movable portion 320 and the fixed portion 310.

In some embodiments, the first clamping side 313 includes a first extension portion 313a, a bent portion 313b and a second extension portion 313c which are coupled in sequence. An end of the first extension portion 313a away from the bent portion 313b is further coupled to the first side portion 312. A bending direction of the bent portion 313b is configured to enable the first and second extension portions 313a, 313c to extend in opposite directions. At this point, a space between the first and second extension portions 313a, 313c forms the guide groove 314. An opening of the guide groove 314 faces the first side portion 312. The second clamping side 323 extends into the guide groove 314 through the opening of the guide groove 314, so as to realize sliding coupling between the second clamping side 323 and the guide groove 314.

In an embodiment, referring to FIGS. 21b and 22, a reinforcing rib 320a is provided at the movable portion 320. The reinforcing rib 320a optimizes a structural strength of the movable portion 320, and improves mechanical stability of the whole protective shell. The distribution of the reinforcing ribs 320a is not particularly limited, and for example, the reinforcing ribs 320a are provided at the second body 321 or the second side portion 322. The number of the reinforcing ribs 320a is not particularly limited, and may be, for example, 2, 3, 4, or the like.

In some embodiments, the reinforcing rib 320a protrudes towards the fixed portion 310 and is in contact with the fixed portion 310. For example, the reinforcing rib 320a provided at the second body 321 protrudes towards the first body 311 and is in contact with the first body 311. The reinforcing rib 320a provided at the second side portion 322 protrudes towards the first side portion 312 and is in contact with the first side portion 312. In this way, the movable portion 320 contacts the fixed portion 310 only at the reinforcing rib 320a, which reduces sliding resistance when the movable portion 320 and the fixed portion 310 are relatively moved, such that the protective shell may be smoothly switched between the extended form and the retracted form.

In an embodiment, with continued reference to FIG. 18, in the movable portion 320, a recessed region 321b is provided at the edge of the second body 321 away from the housing 210. In the electronic device, the display screen below the movable portion 320 is exposed by the recessed region 321b, such that the side surface of the electronic device is covered by the display screen to optimize the display effect of the display screen.

In summary, the protective shell 300 adapts to the extended form and the retracted form of the electronic device with the fixed portion 310 and the movable portion 320 coupled movably. Effective protection is provided in different forms of the electronic device, the internal structure of the electronic device is prevented from being exposed, and the structural safety and the use experiences of the whole device are optimized.

The electronic device according to the embodiments of the present disclosure further includes a display-screen supporting mechanism. The display-screen supporting mechanism is provided below the flexible display screen 100 and configured to support the flexible display screen 100 at the front surface of the electronic device.

Figure 23A:
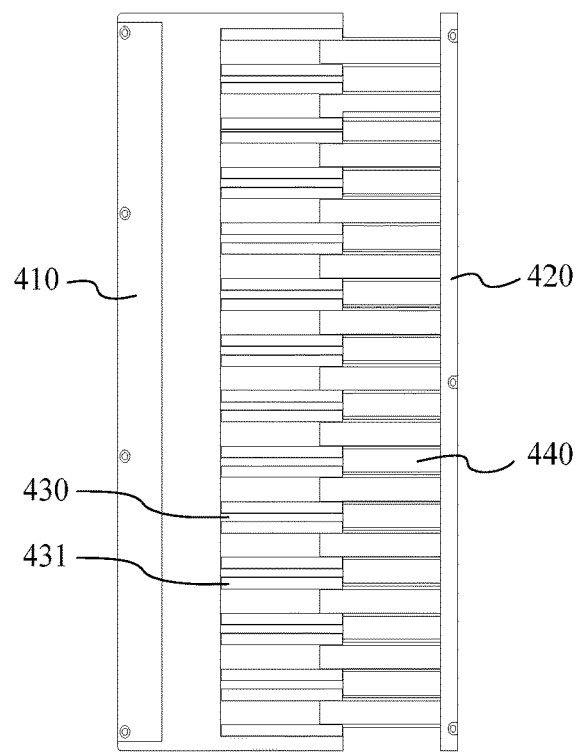
FIGS. 23a and 23b are schematic structural diagrams of a display-screen supporting mechanism in different forms according to an exemplary embodiment.
Figure 23B:
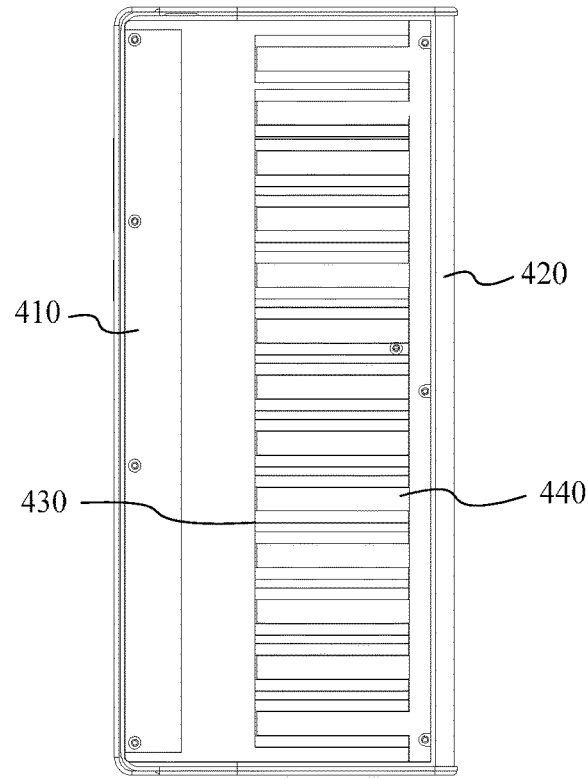

FIGS. 23a and 23b are schematic structural diagrams of a display-screen supporting mechanism in different forms according to an exemplary embodiment. As illustrated in FIGS. 23a and 23b, the display-screen supporting mechanism 400 is provided below the flexible display screen 100 for bearing the flexible display screen 100. In at least one embodiment, the display-screen supporting mechanism 400 includes a fixed supporting member 410 and a movable supporting member 420.

Figure 24:
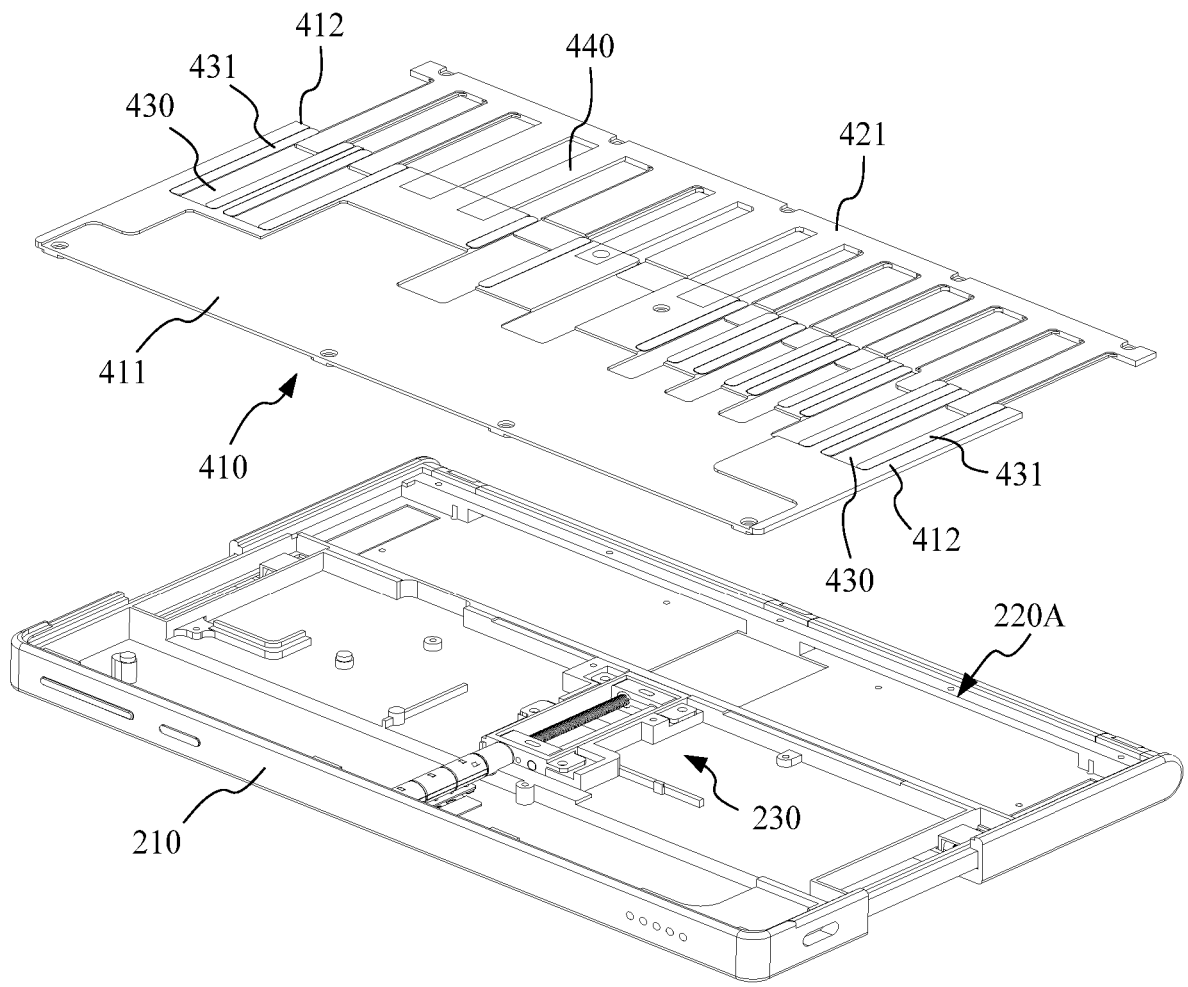
FIG. 24 is a schematic diagram of assembly of a display-screen supporting mechanism in an electronic device according to an exemplary embodiment.

FIG. 24 is a schematic diagram of assembly of the display-screen supporting mechanism in the electronic device according to an exemplary embodiment. As illustrated in FIG. 24, the fixed supporting member 410 is configured to be coupled to the housing 210. The movable supporting member 420 is configured to be coupled to the movable member 220A. One of the fixed and movable supporting members 410, 420 is provided with a guide groove 430, the other is provided with a guide rail 440, and the fixed and movable supporting members 410, 420 are movably coupled by means of the guide groove 430 and the guide rail 440.

In this way, as the movable member 220A is moved relative to the housing 210, the fixed and movable supporting members 410, 420 are driven to be moved relative to each other. In at least one embodiment, as illustrated in FIG. 23a, when the electronic device is in the extended form, the movable member 220A moves away from the housing 210, and the movable supporting member 420 is driven to move away from the fixed supporting member 410. As illustrated in FIG. 23b, when the electronic device is in the retracted form, the movable member 220A moves towards the housing 210, and the movable supporting member 420 is driven to move towards the fixed supporting member 410.

In this way, the display-screen supporting mechanism 400 is able to adapt to the extended and retracted forms of the electronic device, and may provide effective support for the flexible display screen 100 in both the extended and retracted forms of the electronic device.

In the embodiments of the present disclosure, there is no limitation in the arrangement of the guide rail and the guide groove, and just as an example, in the accompanying drawings, the guide groove 430 is provided in the fixed supporting member 410, and the guide rail 440 is provided at the movable supporting member 420.

In an embodiment, the fixed supporting member 410 includes a fixed portion 411 and at least two guide portions 412 coupled to the fixed portion 411. For example, the guide portion 412 is coupled to an edge of the fixed portion 411 and extends in a direction away from the fixed portion 411. The fixed portion 411 is configured to be coupled to the housing in the electronic device. The guide portion 412 is provided with the guide groove 430, and the guide rail 440 of the movable supporting member 420 is inserted into the guide groove.

The movable supporting member 420 includes a coupling portion 421 and at least two guide rails 440 coupled to the coupling portion 421. The guide rail 440 is coupled to an edge of the coupling portion 421 and extends in a direction away from the coupling portion 421. The coupling portion 421 is configured to be coupled to the movable assembly in the electronic device. Thus, the movable and fixed supporting members 420, 410 may be moved synchronously with the relative movement of the housing and the movable assembly.

Figure 25A:
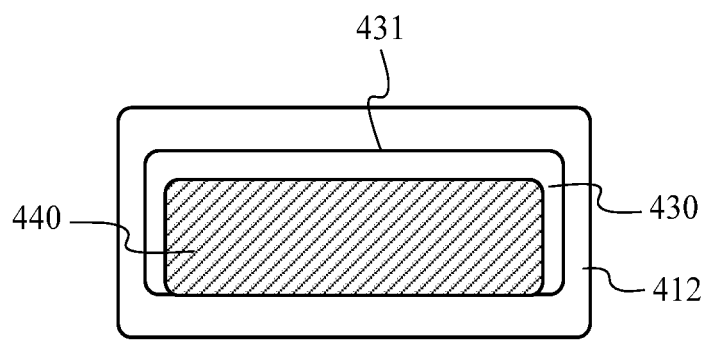
FIGS. 25a and 25b are schematic structural diagrams of a guide groove according to different exemplary embodiments.
Figure 25B:
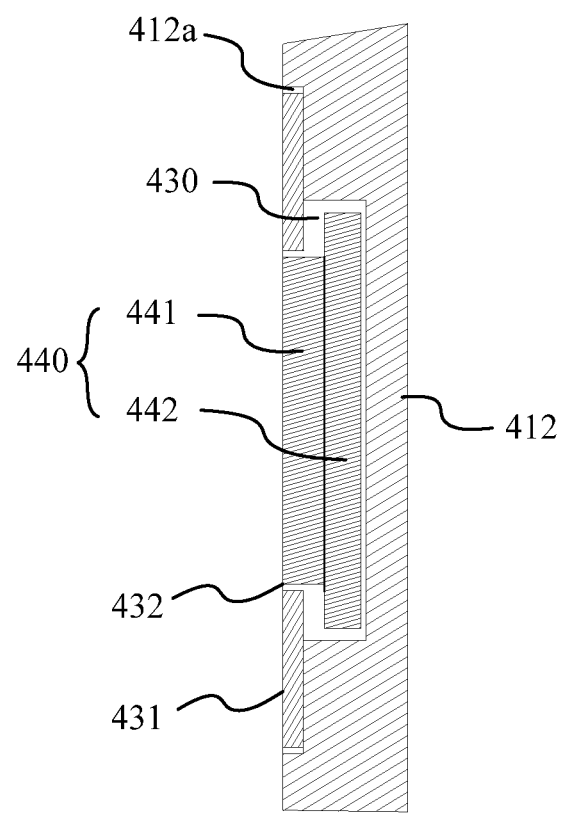

Two different arrangements of the guide groove 430 are provided in the embodiments of the present disclosure, and FIGS. 25a and 25b are schematic structural diagrams of the guide groove according to different exemplary embodiments.

First Arrangement

As illustrated in FIG. 25a, the guide portion 412 has a hollow rod-shaped structure, and the hollow part of the guide portion 412 forms the guide groove 430. At this point, an inner wall of the guide groove 430 forms the limiting member 431 to limit the guide rail 440 in a direction perpendicular to a length of the guide groove 430. In this way, the guide groove 430 substantially protects structural safety of the guide rail 440. In this solution, the shape of a radial cross section of the guide groove 430 is not particularly limited, and may be, for example, a rectangular shape, a circular shape, or the like.

Second Arrangement

As illustrated in FIG. 25b in conjunction with FIG. 23a, the guide groove 430 forms an opening 432 in the guide portion 412, and the opening 432 is distributed along a length direction of the guide groove 430. When inserted into the guide groove 430, the guide rail 440 is exposed to the outside of the guide groove 430 through the opening 432. In addition, a surface of the guide rail 440 exposed to the outside of the guide groove 430 is flush with a surface of the guide portion 412 around the opening 431. Thus, a flat surface formed by the guide rail 440 and the guide portion 412 may stably support the flexible display screen 100.

In this way, a processing difficulty of the whole supporting mechanism may be reduced. In particular, when the guide portion 412 has a small thickness, the guide groove 430 having the opening 432 is easier to realize.

Further, the limiting member 431 is provided at the guide portion 412 at an edge of the opening 432 of the guide groove 430 and extends transversely towards the opening 432. At this point, a size of the opening 432 is reduced by the limiting member 431. The limiting member 431 is configured to limit the guide rail 440 in the guide groove 430 in the direction perpendicular to the length of the guide rail, thereby improving structural stability of the overall supporting mechanism.

In some embodiments, a recessed region 412a is provided at the edge of the opening 432 of the guide portion 412, and the limiting member 431 is mounted in the recessed region 412a. Thus, outer surfaces of the limiting member 431, the guide rail 440 and the guide portion 412 are flush to provide stable support for the flexible display screen.

The limiting member 431 may be provided in various ways.

In some embodiments, the limiting member 431 is provided at one edge of the opening 432. Or, the limiting members 431 are arranged at two opposite edges of the opening 432.

In some embodiments, the limiting member 431 is provided through the length direction of the guide groove 430. Or, the display-screen supporting structure includes a plurality of limiting members 431 spaced apart by a set distance along the length direction of the guide groove 430.

In addition, based on the structure of the guide groove 430 in FIG. 25b, the guide rail 440 includes a first portion 441 and a second portion 442. The first and second portions 441, 442 are arranged in a depth direction of the guide groove 430, and the first portion 441 is relatively close to the opening 432. The second portion 442 is provided beyond the first portion 441 in a direction perpendicular to a depth direction of the guide groove. At this point, the part of the second portion 442 beyond the first portion 441 is provided corresponding to the limiting member 431. In this way, the limiting member 431 is fitted with the second portion 442, such that the guide rail 440 is not separated from the guide groove 430, thus guaranteeing the structural stability of the entire display-screen supporting mechanism.

The first portion 441 is exposed to the outside of the guide groove 430 through the opening 432, and the outer surfaces of the first portion 441, the limiting member 431, and the guide portion 412 are flush with each other. In some embodiments, a gap is defined between a side wall of the limiting member 431 and a side wall of the first portion 441. And/or, a gap is defined between a side wall of the guide groove 430 and a side wall of the second portion 442. For example, a gap of 0.05-0.2 mm is reserved, such that the guide rail 440 may be guaranteed to smoothly slide along the guide groove 430, and a stuck phenomenon is avoided.

The display-screen supporting mechanism 400 according to the embodiments of the present disclosure adapts to the extended and retracted forms of the electronic device with fixed and movable supporting portions 410,420 which move relatively, such that the flexible display screen is comprehensively supported and protected.

Figure 26A:
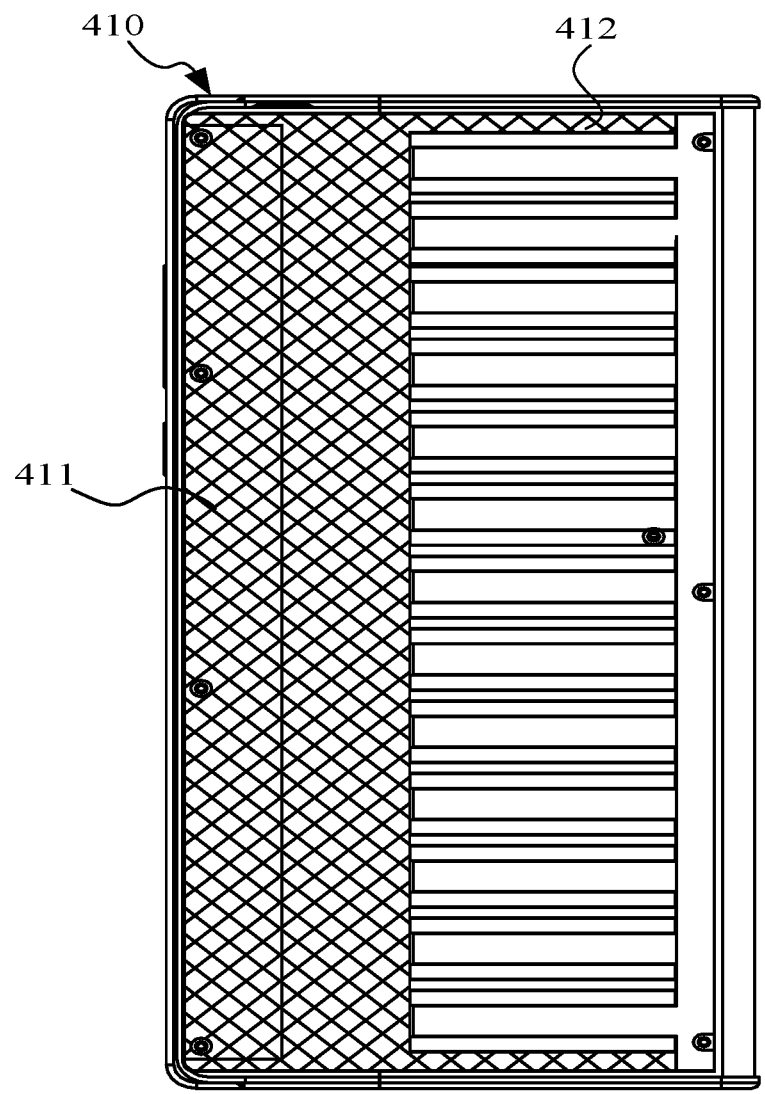
FIGS. 26a and 26b are schematic diagrams of fixation modes of a flexible display screen in an electronic device according to an exemplary embodiment.
Figure 26B:
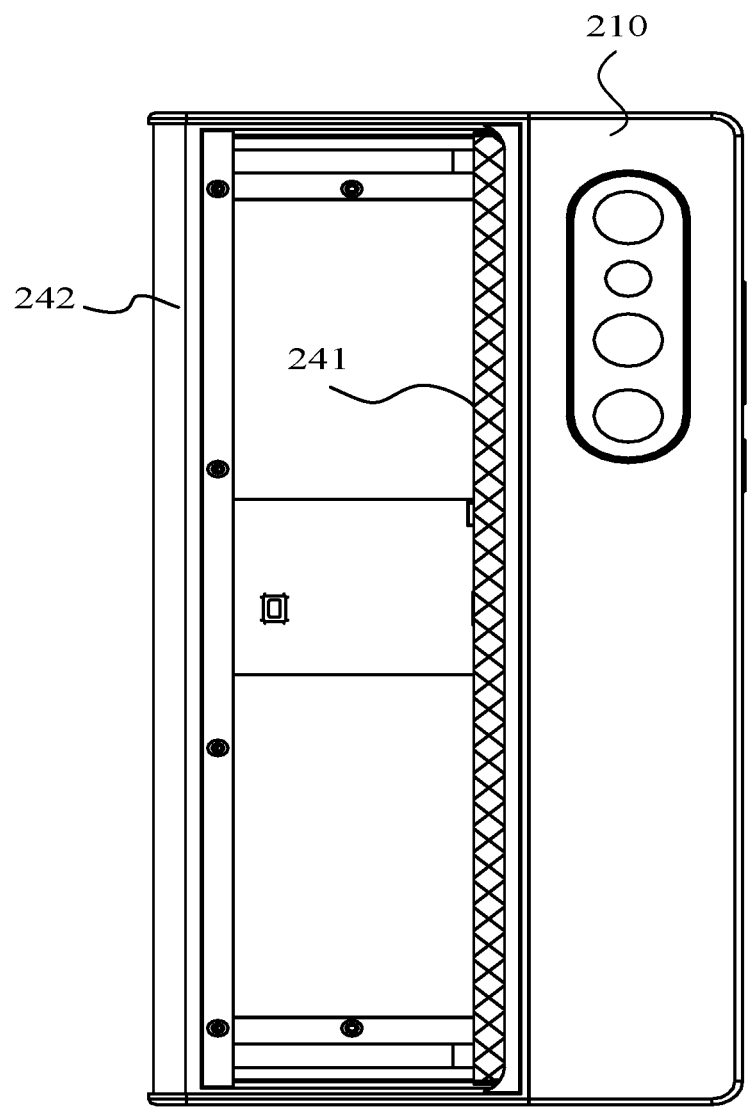

FIGS. 26a and 26b are schematic diagrams of fixation modes of a flexible display screen in an electronic device according to an exemplary embodiment. In conjunction with the housing 210, the movable member 220A and the display-screen supporting mechanism described above, the flexible display screen in the electronic device according to the embodiments of the present disclosure is fixed as follows.

As illustrated in FIG. 26a, the flexible display screen located at the front surface of the electronic device is coupled to the fixed portion 411 of the fixed supporting member 410 in the display-screen supporting mechanism. In some embodiments, the flexible display screen is further coupled to two opposite edges of the guide portion 412 in the fixed supporting member 410. Accordingly, the whole structure of the flexible display screen is guaranteed to be flat.

As illustrated in FIG. 26b, the flexible display screen located at the rear surface of the electronic device is coupled to the sliding member 241 in the telescopic elastic mechanism 220B, such that the flexible display screen may drive the sliding member 241 to slide relative to the support 242, thereby switching the electronic device between the extended form and the retracted from.

Figure 27:
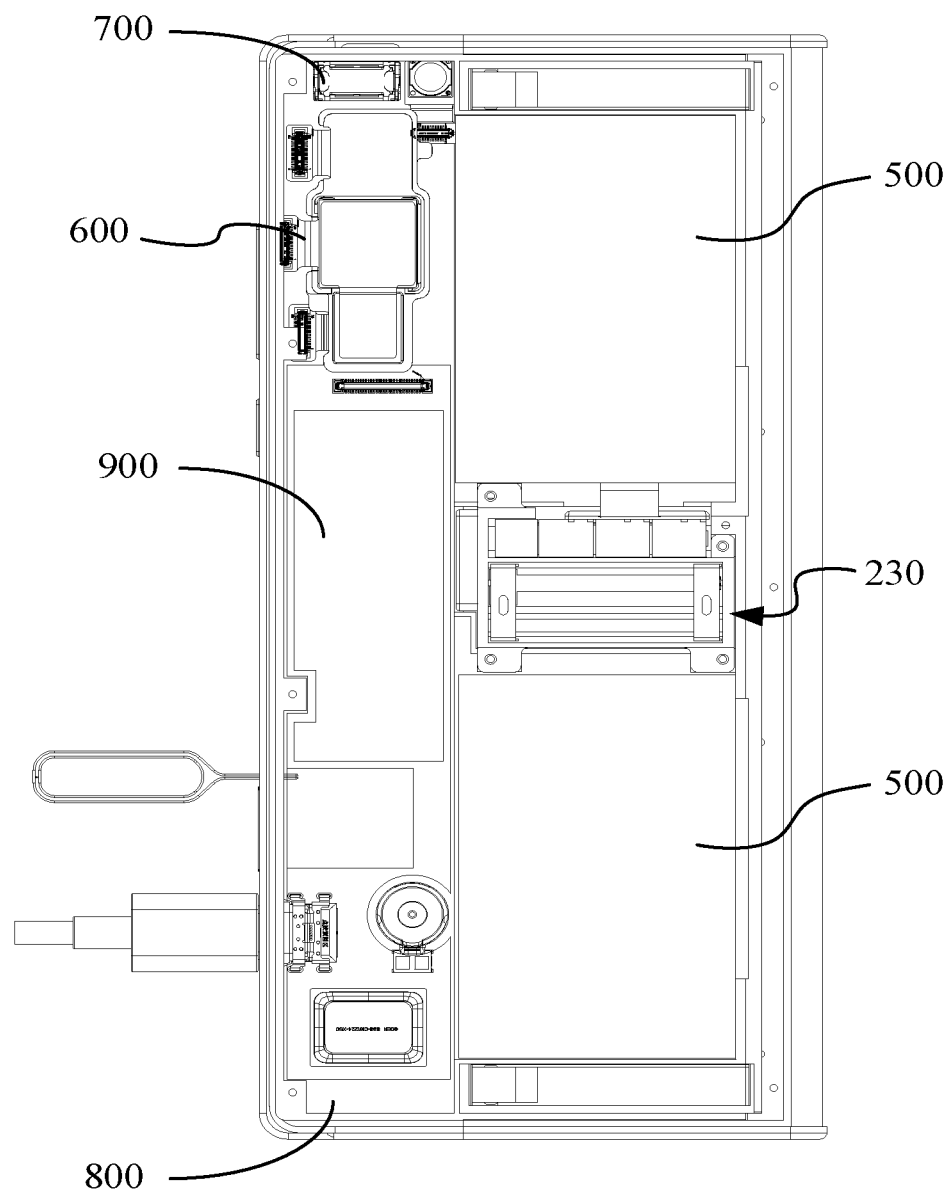
FIG. 27 is a schematic diagram of an internal structure of an electronic device according to an exemplary embodiment.

Furthermore, in the electronic device according to the embodiments of the present disclosure, a stacking solution of functional modules is not specifically limited. FIG. 27 is a schematic diagram of an internal structure of an electronic device according to an exemplary embodiment, and referring to FIG. 27, a battery 500 and the movable assembly 220 are provided in an up-d down direction in the electronic device. For example, the electronic device includes two batteries 500 provided on both sides of the driving motor 2311. A rear camera module 600, an earphone module 700, a microphone module 800, a main board 900, or the like, are provided in the electronic device corresponding to the first side 210a of the housing 210. The above is merely exemplary solutions, and those skilled in the art may set the stacking solution of the functional modules as required in conjunction with the above description.

Figure 28A:
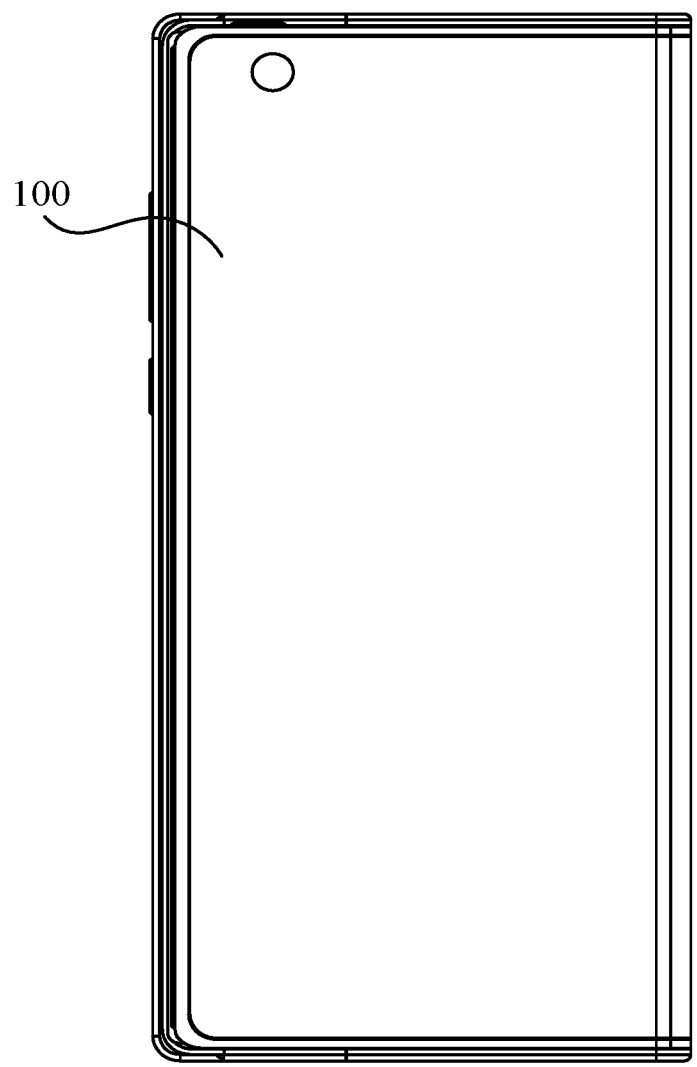
FIG. 28a is a schematic diagram of a front surface of an electronic device in a retracted state according to an exemplary embodiment.
Figure 28B:
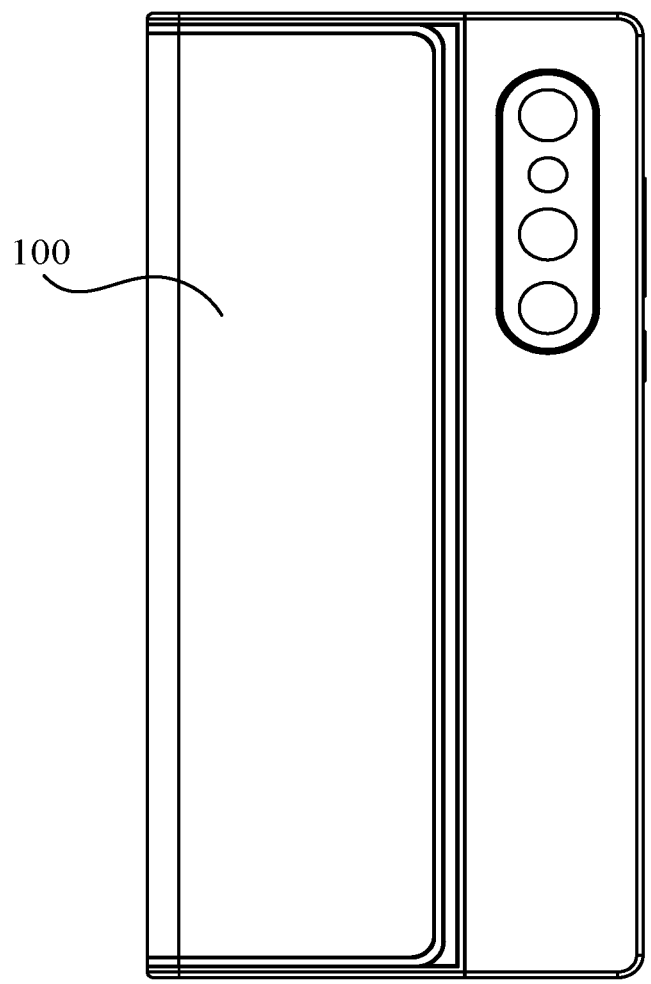
FIG. 28b is a schematic diagram of a rear surface of an electronic device in a retracted state according to an exemplary embodiment.
Figure 28C:
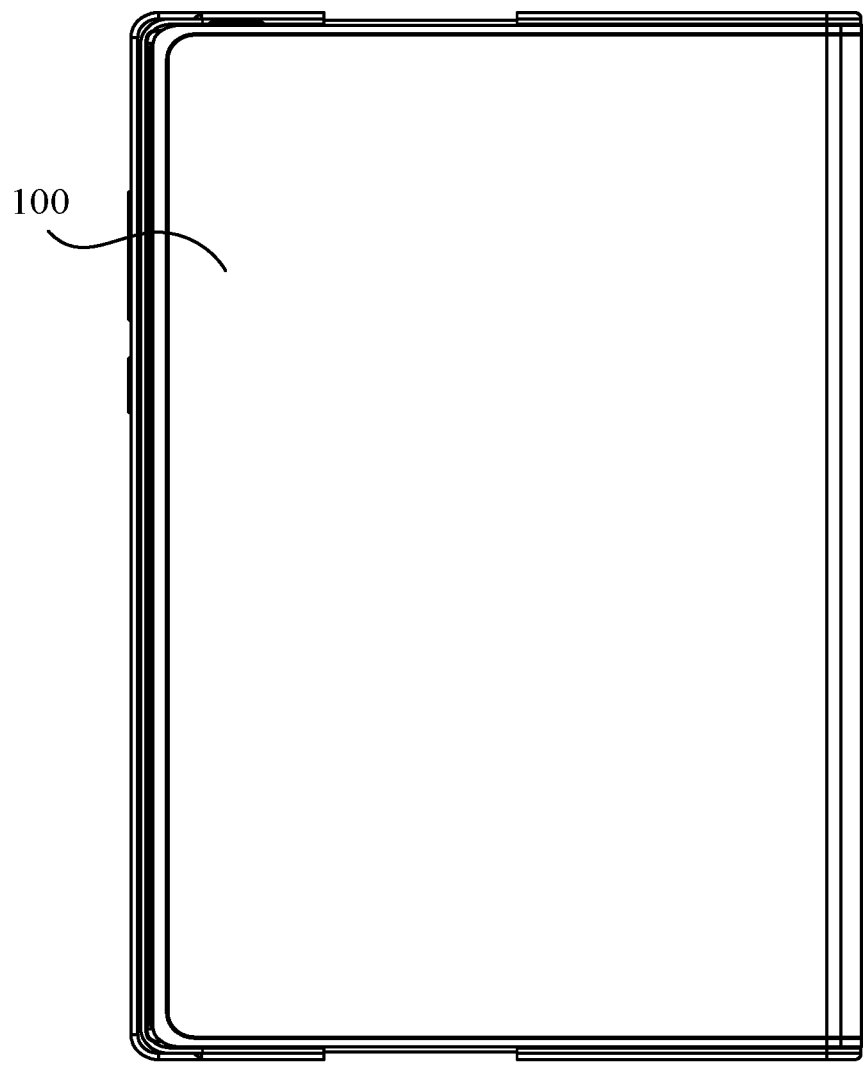
FIG. 28c is a schematic diagram of a front surface of an electronic device in an extended state according to an exemplary embodiment.

FIG. 28a is a schematic diagram of a front surface of an electronic device in a retracted state according to an exemplary embodiment, FIG. 28b is a schematic diagram of a rear surface of an electronic device in a retracted state according to an exemplary embodiment, and FIG. 28c is a schematic diagram of a front surface of an electronic device in an extended state according to an exemplary embodiment.

As illustrated in FIGS. 28a and 28b, in the retracted form of the electronic device according to the embodiments of the present disclosure, the size of the display screen at the front surface of the electronic device is relatively small, and the size of the display screen on the rear surface of the electronic device is relatively large. In this case, the electronic device is suitable for a normal use scenario, such as a communication use scenario, a reading use scenario, or the like.

As illustrated in FIG. 28c, in the extended form of the electronic device according to the embodiments of the present disclosure, the size of the display screen at the front surface of the electronic device is increased. At this point, the electronic device is suitable for special use scenarios, such as a game use scenario, a movie-watching use scenario, or the like.

In conclusion, the electronic device according to the embodiments of the present disclosure may be switched between the extended state and the retracted state to change the size of the display screen at the front surface of the electronic device, thus meeting different user requirements and optimizing use experiences.

Other embodiments of the disclosure will be apparent to those skilled in the art from consideration of the specification and practice of the disclosure disclosed here. This disclosure is intended to cover any variations, uses, or adaptations of the disclosure following the general principles thereof and including such departures from the present disclosure as come within known or customary practice in the art. It is intended that the specification and examples be considered as exemplary only, with a true scope of the disclosure being indicated by the following claims.

What is claimed is:

1. An electronic device, comprising:
a telescopic driving mechanism comprising a housing and a movable assembly, the movable assembly being slidably coupled to the housing and being able to be driven to move towards or away from the housing; and
a flexible display screen comprising a first end and a second end arranged oppositely,
wherein the first end is coupled to the housing and located at a front surface of the electronic device; and the second end is coupled to the movable assembly and wound to a rear surface of the electronic device via a side surface of the electronic device; and the second end moves towards or away from the first end as the movable assembly is moved relative to the housing,
wherein the movable assembly comprises:
a movable member movably coupled to the housing and abutting against a part of the flexible display screen corresponding to the side surface, the flexible display screen is slidable relative to the movable member; and
a telescopic elastic member mounted to the movable member and applying an acting force pointing to the first end to the second end.

2. The electronic device according to claim 1, wherein the telescopic elastic member comprises:
a sliding member coupled to the second end;
a support fixedly coupled to the movable member, slidably coupled to the sliding member, and provided between the sliding member and the side surface; and
an elastic member having a first end coupled to the sliding member and a second end fixed relative to the support, the elastic member being configured to apply an acting force pointing to the first end to the sliding member, so as to drive the sliding member to move away from the support.

3. The electronic device according to claim 2, wherein the elastic member is provided between the support and the sliding member, and compressed to apply a force to the sliding member; or
the first end of the elastic member and the sliding member are provided on a same side of the support, a set distance is kept between the first end of the elastic member and the support, and the elastic member is tensioned to apply a force to the sliding member.

4. The electronic device according to claim 2, wherein a guide member is provided at the support, and movably coupled to the sliding member, and the sliding member is slidable along the guide member.

5. The electronic device according to claim 4, wherein a guide groove fitted with the guide member is provided in the sliding member.

6. The electronic device according to claim 2, wherein a mounting member is provided at the support, and comprises an extension portion and a mounting portion; the extension portion is coupled to the support and extends towards the sliding member, the mounting portion is coupled to a part of the extension portion away from the support, and configured to mount the second end of the elastic member.

7. The electronic device according to claim 6, wherein the mounting portion comprises a side wall coupled to the extension portion, and the side wall extends towards the front surface of the electronic device.

8. The electronic device according to claim 6, wherein a supporting member is provided at the side wall, and is parallel to the front surface of the electronic device, the second end of the elastic member is coupled to the supporting member, and the elastic member is wound around the supporting member.

9. The electronic device according to claim 1, wherein the telescopic driving mechanism further comprises a driving mechanism, the driving mechanism has a first end coupled to the housing and a second end coupled to the movable member, and is configured to drive the movable member to move towards or away from the housing.

10. The electronic device according to claim 1, wherein the telescopic driving mechanism further comprises a distance detecting assembly, the distance detecting assembly is provided to at least one of the housing and the movable member and configured to detect a distance from the housing to the movable member.

11. The electronic device according to claim 1, wherein the movable member comprises a cambered side portion abutting against the flexible display screen.

12. The electronic device according to claim 11, wherein a first transmission member is provided at the cambered side portion, and is rollingly coupled to the flexible display screen.

13. The electronic device according to claim 1, wherein the electronic device further comprises a protective shell provided at the rear surface of the electronic device, and comprising:
a fixed portion coupled to the housing; and
a movable portion provided on a side of the fixed portion facing an inside or outside of the electronic device and movably coupled to the fixed portion;
wherein the movable portion is coupled to the movable assembly, and is movable relative to the housing along with the movable assembly, so as to move away from or towards the fixed portion.

14. The electronic device according to claim 13, wherein a part of the movable portion is overlapped with a part of the fixed portion in a state where the movable portion is maximally displaced relative to the fixed portion.

15. The electronic device according to claim 13, wherein the fixed portion and the movable portion are laminated, and the fixed portion is provided at an outer side the movable portion.

16. The electronic device according to claim 13, wherein the fixed portion comprises a first body and a first side portion, the first body has a plate-shaped structure, and the first side portion is coupled to an edge of the first body and extends in a direction perpendicular to the first body; the first body is provided corresponding to the rear surface of the electronic device, and the first side portion is provided at least corresponding to the side surface of the electronic device;
the movable portion comprises a second body and a second side portion, the second body has a plate-shaped structure, and the second side portion is coupled to an edge of the second body and extends in a direction perpendicular to the second body; the second body is provided corresponding to the first body of the fixed portion, and the second side portion is provided at least corresponding to the side surface of the electronic device.

17. The electronic device according to claim 16, wherein a first clamping side is provided at a part of the first side portion away from the first body, the first clamping side is parallel to the first body and is provided above the flexible display screen of the electronic device;
a second clamping side is provided at a part of the second side portion away from the second body, the second clamping side is parallel to the second body and is provided above the flexible display screen of the electronic device.

18. The electronic device according to claim 1, wherein the electronic device further comprises a display-screen supporting mechanism configured to bear the flexible display screen located at the front surface of the electronic device, and the display-screen supporting mechanism comprises:
a fixed supporting member coupled to the housing; and
a movable supporting member coupled to the movable assembly;
wherein the fixed supporting member is movably coupled to the movable supporting member and is movable relative to the housing along with the movable assembly, so as to move away from or towards the fixed supporting member.

19. The electronic device according to claim 18, wherein one of the fixed and movable supporting members is provided with at least two guide grooves, and the other is provided with at least two supporting rails inserted into the guide grooves.

* * * * *